United States Patent
Wolcott et al.

(10) Patent No.: US 11,726,127 B2
(45) Date of Patent: Aug. 15, 2023

(54) DETECTING WIRELESS SIGNAL LEAKAGE

(71) Applicant: Comcast Cable Communications, LLC, Philadelphia, PA (US)

(72) Inventors: Larry Wolcott, Denver, CO (US); John Heslip, Evergreen, CO (US); Michael O'Dell, New Castle, PA (US); Thomas Bach, Lone Tree, CO (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 0 days.

(21) Appl. No.: 17/835,529

(22) Filed: Jun. 8, 2022

(65) Prior Publication Data

US 2022/0299556 A1    Sep. 22, 2022

Related U.S. Application Data

(63) Continuation of application No. 16/674,370, filed on Nov. 5, 2019, now Pat. No. 11,402,421.

(51) Int. Cl.
| | |
|---|---|
| *G01R 31/08* | (2020.01) |
| *G01S 3/802* | (2006.01) |
| *H04B 17/00* | (2015.01) |
| *H04W 4/02* | (2018.01) |
| *G01R 31/50* | (2020.01) |

(52) U.S. Cl.
CPC ............ *G01R 31/08* (2013.01); *G01R 31/50* (2020.01); *G01S 3/8022* (2013.01); *H04B 17/0085* (2013.01); *H04W 4/023* (2013.01)

(58) Field of Classification Search
CPC ........ H04W 24/08; H04W 8/02; H04W 24/00
See application file for complete search history.

(56) References Cited

U.S. PATENT DOCUMENTS

| | | | |
|---|---|---|---|
| 6,005,518 A | 12/1999 | Kallina | |
| 8,035,508 B2 | 10/2011 | Breed | |
| 9,344,306 B2 | 5/2016 | Chen et al. | |
| 2008/0033698 A1 | 2/2008 | Stelle | |
| 2012/0052892 A1 | 3/2012 | Braithwaite | |
| 2012/0100847 A1* | 4/2012 | Rahman | H04W 24/00 455/424 |
| 2013/0291044 A1 | 10/2013 | Zinevich | |
| 2013/0324147 A1* | 12/2013 | Ong | G01S 5/02527 455/456.1 |
| 2014/0036975 A1* | 2/2014 | Wolcott | H04B 17/364 375/224 |
| 2014/0072064 A1 | 3/2014 | Lemson et al. | |

(Continued)

FOREIGN PATENT DOCUMENTS

| | | |
|---|---|---|
| KR | 20170133982 A | 12/2017 |
| WO | 2016044518 A1 | 3/2016 |
| WO | 2017192206 A2 | 11/2017 |

*Primary Examiner* — Jermele M Hollington
*Assistant Examiner* — Temilade S Rhodes-Vivour
(74) *Attorney, Agent, or Firm* — Banner & Witcoff, Ltd.

(57) ABSTRACT

Systems, apparatuses, and methods are described for operating and maintaining a data network, and for detecting problems such as signal leakage. In one implementation, a computing device may determine, based on availability and location, one or more mobile devices and may cause the mobile devices to detect a wireless signal. The detected wireless signal may be identified as having leaked from a network, such as a wired network, and used to detect the source of leaks.

23 Claims, 14 Drawing Sheets

(56) References Cited

U.S. PATENT DOCUMENTS

| | | | |
|---|---|---|---|
| 2015/0181442 A1* | 6/2015 | Zinevich | H04B 17/318 455/424 |
| 2016/0330546 A1 | 11/2016 | Barrentine et al. | |
| 2017/0237484 A1* | 8/2017 | Heath | H04B 1/525 398/26 |
| 2017/0366983 A1* | 12/2017 | Gunasekara | H04L 43/0811 |

* cited by examiner

DETECTING WIRELESS SIGNAL LEAKAGE

CROSS-REFERENCE TO RELATED APPLICATION(S)

This application is a continuation of U.S. application Ser. No. 16/674,370, filed Nov. 5, 2019, the disclosure of which is incorporated by reference herein in its entirety.

BACKGROUND

Network service providers provide communication services (e.g., telecommunication services, Internet connection, and multimedia data service for a massive number of users) via a network that may include wireless and/or wired communication links. Network service providers typically send technicians to set up service or diagnose problems associated with the services, which may be costly, time consuming, and inefficient. Scheduling an appointment for the technician's diagnosis may be inconvenient for users and may cause a delay in diagnosing and addressing the problems. These and other shortcomings are identified and addressed by this disclosure.

SUMMARY

Features described herein allow various communication devices to assist in diagnosing potential signal leaks in a wired communication network by using radio receivers that may be available, such as radio receivers in network devices, radio receivers equipped in user devices such as mobile devices (e.g., smartphones), etc. The radio receivers may be in various communication devices comprising network devices, such as devices in users' homes and outside users' homes, remote devices, such as mobile devices of users, technicians, and other data collecting entities. Users may be asked to move and/or rotate their mobile devices while the mobile devices are detecting potential signal leaks. Mobile devices of users may be controlled for a diagnostic radio signal detection (e.g., at a physical location, such as homes, businesses, or other locations). A computing device may send, via a mobile communication network, one or more wireless signals to control the one or more mobile devices to detect a diagnostic radio signal output from a potential leakage spot of a wired network. The one or more mobile devices may activate, based on a wireless signal caused by the computing device, a radio signal receiver. The one or more mobile devices may use one or more sensors to determine one or more parameters of the diagnostic radio signal (e.g., a received signal power, a direction, and/or a location of the diagnostic radio signal).

The preceding summary presents a simplified summary of certain features. The summary is not an extensive overview and is not intended to identify key or critical elements. These and other features and advantages are described in greater detail below.

BRIEF DESCRIPTION OF THE DRAWINGS

Some features are shown by way of example, and not by limitation, in the accompanying drawings. In the drawings, like numerals reference similar elements.

DETAILED DESCRIPTION

Figure 1:
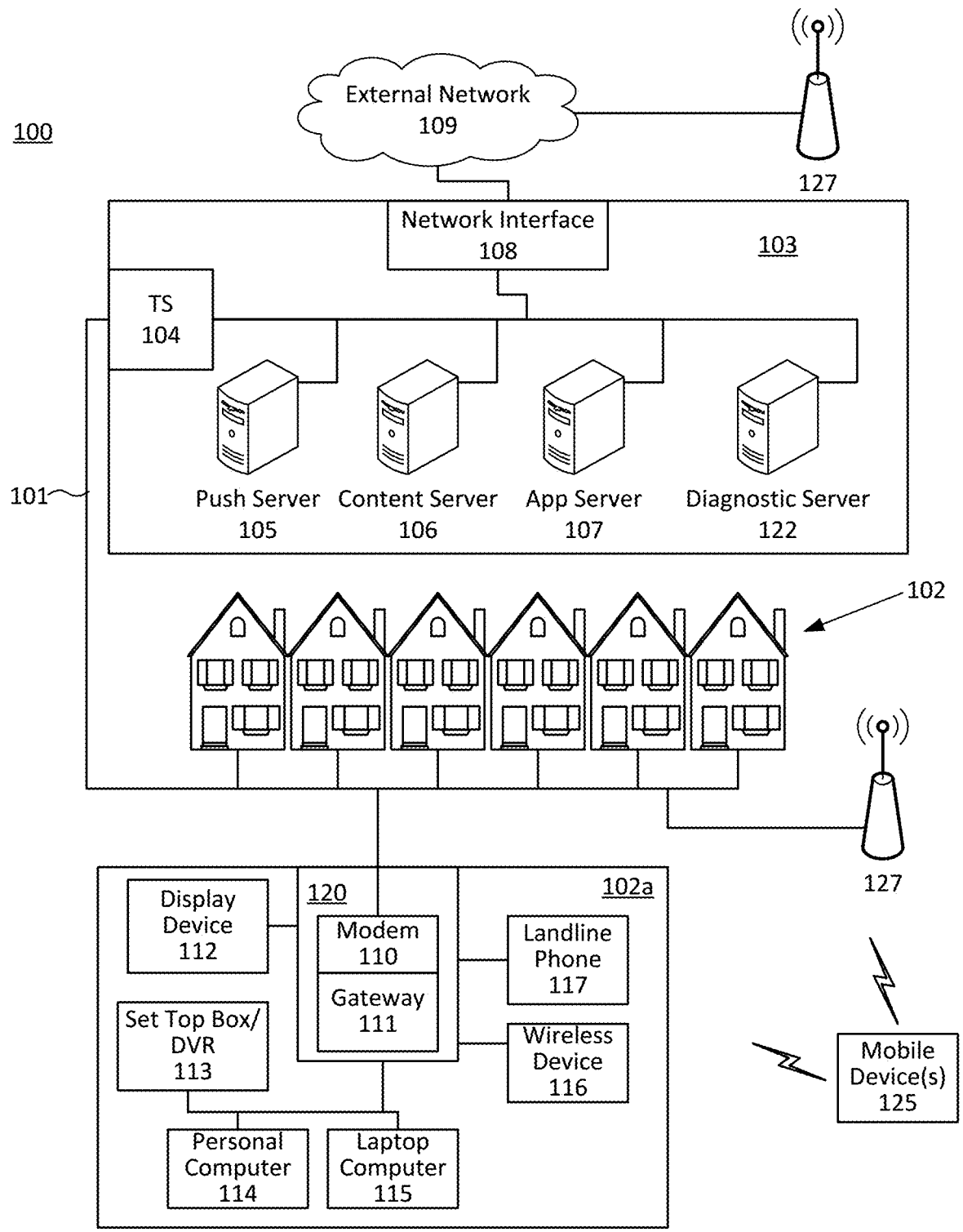
FIG. 1 shows an example communication network.

The accompanying drawings, which form a part hereof, show examples of the disclosure. It is to be understood that the examples shown in the drawings and/or discussed herein are non-exclusive and that there are other examples of how the disclosure may be practiced.

FIG. 1 shows an example communication network 100. The communication network 100 may comprise one or more information distribution networks of any type, such as, without limitation, a telephone network, a wireless network (e.g., an LTE network, a 5G network, a WiFi IEEE 802.11 network, a WiMAX network, a satellite network, and/or any other network for wireless communication), an optical fiber network, a coaxial cable network, and/or a hybrid fiber/coax distribution network. The communication network 100 may use a series of interconnected communication links 101 (e.g., coaxial cables, optical fibers, wireless links, etc.) to connect multiple premises 102 (e.g., businesses, homes, consumer dwellings, train stations, airports, etc.) to a local office 103 (e.g., a headend). The local office 103 may send downstream information signals and receive upstream information signals via the communication links 101. Each of the premises 102 may comprise devices, described below, to receive, send, and/or otherwise process those signals and information contained therein.

The communication links 101 may originate from the local office 103 and may comprise components not shown, such as optical links, optical nodes, splitters, filters, amplifiers, etc., to help convey signals clearly. The communication links 101 may be coupled to one or more wireless access points 127 configured to communicate with one or more mobile devices 125 via one or more wireless networks. The mobile devices 125 may comprise smart phones, tablets or laptop computers with wireless transceivers, tablets or laptop computers communicatively coupled to other devices with wireless transceivers, and/or any other type of device configured to communicate via a wireless network.

The local office 103 may comprise an interface 104, such as a termination system (TS). The interface 104 may comprise a cable modem termination system (CMTS) and/or other computing device(s) configured to send information downstream to, and to receive information upstream from, devices communicating with the local office 103 via the communications links 101. The interface 104 may be configured to manage communications among those devices, to manage communications between those devices and back-end devices such as servers 105-107 and 122, and/or to manage communications between those devices and one or more external networks 109. The local office 103 may comprise one or more network interfaces 108 that comprise circuitry needed to communicate via the external networks 109. The external networks 109 may comprise networks of Internet devices, telephone networks, wired networks, wireless networks, fiber optic networks, and/or any other desired network. The local office 103 may also or alternatively communicate with the mobile devices 125 via the interface 108 and one or more of the external networks 109 (e.g., via one or more of the wireless access points 127).

The push notification server 105 may be configured to generate push notifications to deliver information to devices in the premises 102 and/or to the mobile devices 125. The content server 106 may be configured to provide content to devices in the premises 102 and/or to the mobile devices 125. This content may comprise, for example, video, audio, text, web pages, images, files, etc. The content server 106 (or, alternatively, an authentication server) may comprise software to validate user identities and entitlements, to locate and retrieve requested content, and/or to initiate delivery (e.g., streaming) of the content. The application server 107 may be configured to offer any desired service. For example, an application server may be responsible for collecting, and generating a download of, information for electronic program guide listings. Another application server may be responsible for monitoring user viewing habits and collecting information from that monitoring for use in selecting advertisements. Yet another application server may be responsible for formatting and inserting advertisements in a video stream being transmitted to devices in the premises 102 and/or to the mobile devices 125. The local office 103 may comprise additional servers, such as the diagnostic server 122 (described below), additional push, content, and/or application servers, and/or other types of servers. Although shown separately, the push server 105, the content server 106, the application server 107, the diagnostic server 122, and/or other server(s) may be combined. The servers 105, 106, 107, and 122, and/or other servers, may be computing devices and may comprise memory storing data and also storing computer executable instructions that, when executed by one or more processors, cause the server(s) to perform steps described herein.

An example premises 102a may comprise an interface 120. The interface 120 may comprise circuitry used to communicate via the communication links 101. The interface 120 may comprise a modem 110, which may comprise transmitters and receivers used to communicate via the communication links 101 with the local office 103. The modem 110 may comprise, for example, a coaxial cable modem (for coaxial cable lines of the communication links 101), a fiber interface node (for fiber optic lines of the communication links 101), twisted-pair telephone modem, a wireless transceiver, and/or any other desired modem device. One modem is shown in FIG. 1, but a plurality of modems operating in parallel may be implemented within the interface 120. The interface 120 may comprise a gateway 111. The modem 110 may be connected to, or be a part of, the gateway 111. The gateway 111 may be a computing device that communicates with the modem(s) 110 to allow one or more other devices in the premises 102a to communicate with the local office 103 and/or with other devices beyond the local office 103 (e.g., via the local office 103 and the external network(s) 109). The gateway 111 may comprise a set-top box (STB), digital video recorder (DVR), a digital transport adapter (DTA), a computer server, and/or any other desired computing device.

The gateway 111 may also comprise one or more local network interfaces to communicate, via one or more local networks, with devices in the premises 102a. Such devices may comprise, e.g., display devices 112 (e.g., televisions), STBs or DVRs 113, personal computers 114, laptop computers 115, wireless devices 116 (e.g., wireless routers, wireless laptops, notebooks, tablets and netbooks, cordless phones (e.g., Digital Enhanced Cordless Telephone-DECT phones), mobile phones, mobile televisions, personal digital assistants (PDA)), landline phones 117 (e.g. Voice over Internet Protocol VoIP phones), and any other desired devices. Example types of local networks comprise Multimedia Over Coax Alliance (MoCA) networks, Ethernet networks, networks communicating via Universal Serial Bus (USB) interfaces, wireless networks (e.g., IEEE 802.11, IEEE 802.15, Bluetooth), networks communicating via in-premises power lines, and others. The lines connecting the interface 120 with the other devices in the premises 102a may represent wired or wireless connections, as may be appropriate for the type of local network used. One or more of the devices at the premises 102a may be configured to provide wireless communications channels (e.g., IEEE 802.11 channels) to communicate with one or more of the mobile devices 125, which may be on- or off-premises.

The mobile devices 125, one or more of the devices in the premises 102a, and/or other devices may receive, store, output, and/or otherwise use assets. An asset may comprise a video, a game, one or more images, software, audio, text, webpage(s), and/or other content.

Figure 2:
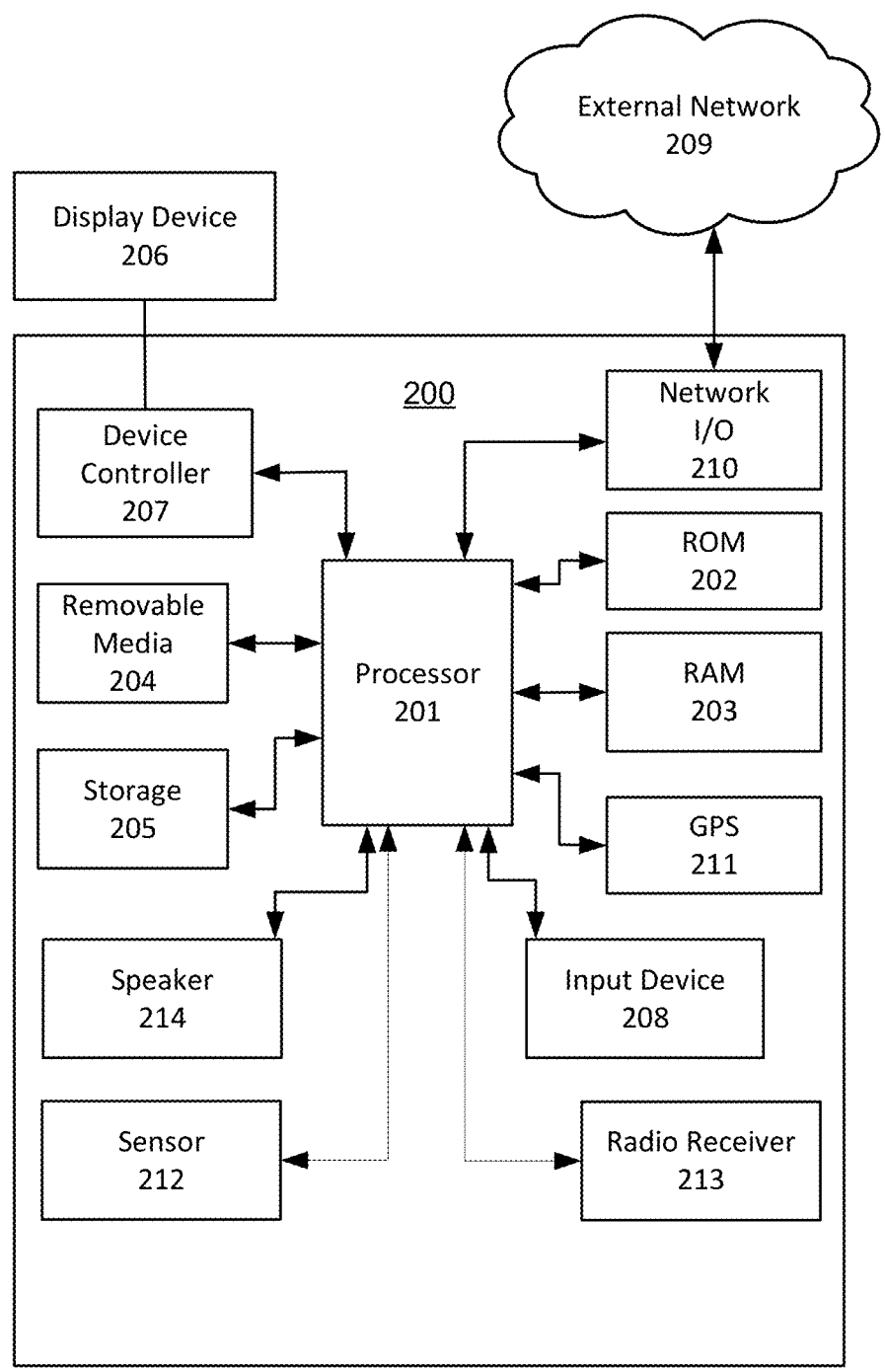
FIG. 2 shows hardware elements of a computing device.

FIG. 2 shows hardware elements of a computing device 200 that may be used to implement any of the computing devices shown in FIG. 1 (e.g., the mobile devices 125, any of the devices shown in the premises 102a, any of the devices shown in the local office 103, any of the wireless access points 127, any devices with the external network 109) and any other computing devices discussed herein (e.g., the diagnostic server 122). The computing device 200 may comprise one or more processors 201, which may execute instructions of a computer program to perform any of the functions described herein. The instructions may be stored in a read-only memory (ROM) 202, random access memory (RAM) 203, removable media 204 (e.g., a USB drive, a compact disk (CD), a digital versatile disk (DVD)), and/or in any other type of computer-readable medium or memory. Instructions may also be stored in an attached (or internal) storage 205 (e.g., a hard drive) or other types of storage media. The computing device 200 may comprise one or more output devices, such as a display device 206 (e.g., an external television and/or other external or internal display device) and a speaker 214, and may comprise one or more output device controllers 207, such as a video processor. One or more user input devices 208 may comprise a remote control, a keyboard, a mouse, a touch screen (which may be integrated with the display device 206), microphone, etc. The computing device 200 may also comprise one or more network interfaces, such as a network input/output (I/O) interface 210 (e.g., a network card) to communicate with an external network 209. The network I/O interface 210 may be a wired interface (e.g., electrical, RF (via coax), optical (via fiber)), a wireless interface (e.g., a Wi-Fi interface, a Bluetooth interface, a cellular mobile communication interface, such as 2G, 3G, 4G LTE, 5G, etc.), or a combination of the two. The network I/O interface 210 may comprise a modem configured to communicate via the external network 209. The external network 209 may comprise the communication links 101 discussed above, the external network 109, an in-home network, a network provider's wireless, coaxial, fiber, or hybrid fiber/coaxial distribution system (e.g., a DOCSIS network), or any other desired network. The computing device 200 may comprise a location-detecting device, such as a global positioning system (GPS) microprocessor 211, which may be configured to receive and process global positioning signals and determine, with possible assistance from an external server and antenna, a geographic position of the computing device 200. The computing device 200 may also comprise one or more sensors 212, such as a touchscreen sensor, a gyroscope, an accelerometer, a magnetometer, a digital compass, a proximity sensor, an ambient light sensor, a pedometer, a barcode/QR code sensor, a barometer, a thermometer, an air humidity sensor, a heartrate sensor, a biometric sensor (e.g., a fingerprint sensor, an eye scanner), a Near-Field Communication (NFC) receiver, etc. The computing device 200 may also comprise a radio signal receiver 213, such as an FM tuner.

Although FIG. 2 shows an example hardware configuration, one or more of the elements of the computing device 200 may be implemented as software or a combination of hardware and software. Modifications may be made to add, remove, combine, divide, etc. components of the computing device 200. Additionally, the elements shown in FIG. 2 may be implemented using basic computing devices and components that have been configured to perform operations such as are described herein. For example, a memory of the computing device 200 may store computer-executable instructions that, when executed by the processor 201 and/or one or more other processors of the computing device 200, cause the computing device 200 to perform one, some, or all of the operations described herein. Such memory and processor(s) may also or alternatively be implemented through one or more Integrated Circuits (ICs). An IC may be, for example, a microprocessor that accesses programming instructions or other data stored in a ROM and/or hardwired into the IC. For example, an IC may comprise an Application Specific Integrated Circuit (ASIC) having gates and/or other logic dedicated to the calculations and other operations described herein. An IC may perform some operations based on execution of programming instructions read from ROM or RAM, with other operations hardwired into gates or other logic. Further, an IC may be configured to output image data to a display buffer.

Figure 3:
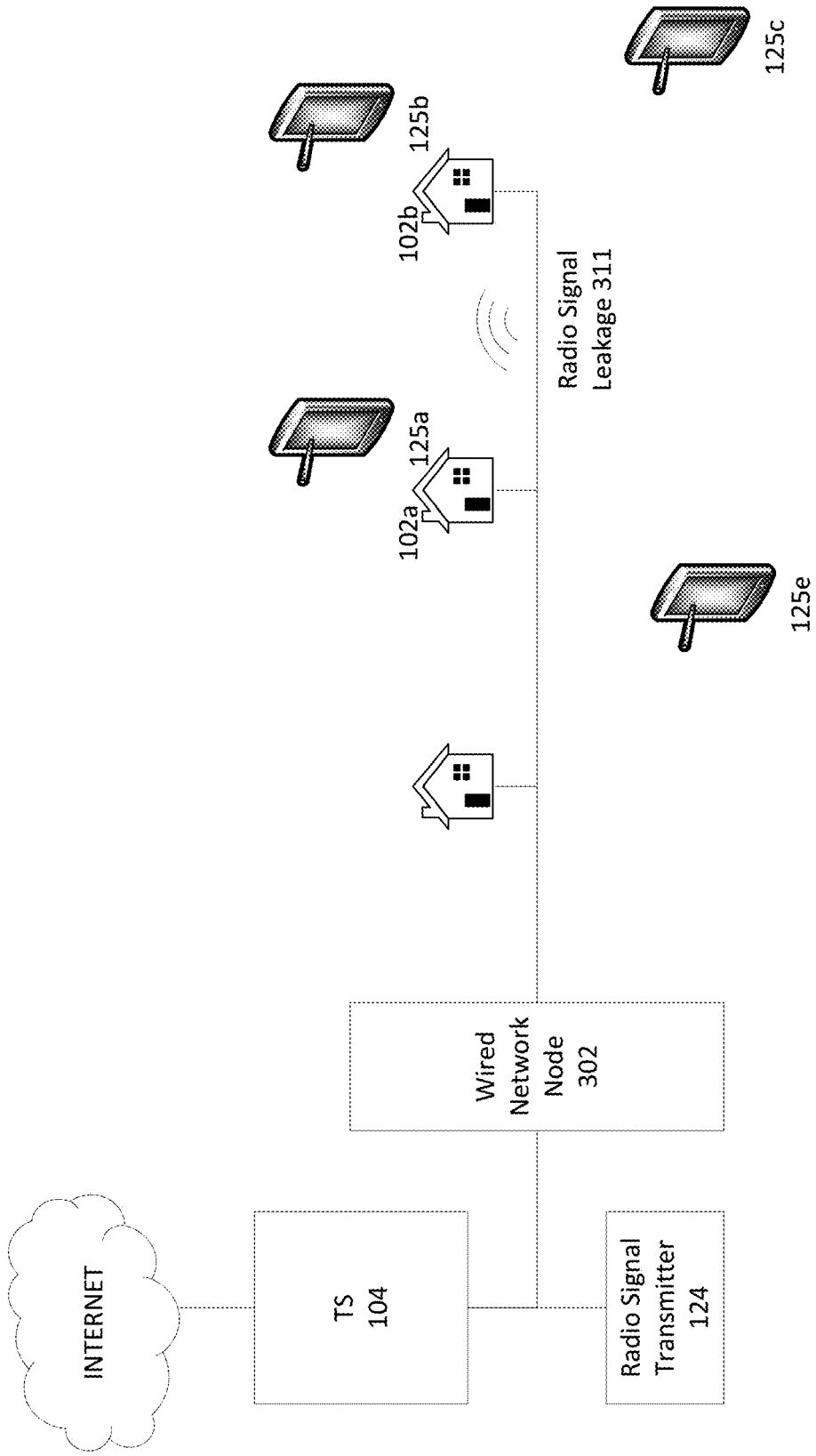
FIG. 3 shows an example communication network that may communicate via a wired network.

FIG. 3 shows an example communication network that may communicate via a wired network (e.g., a Hybrid Fiber Coaxial (HFC) network). Wired lines of the wired network may be shielded to prevent loss of signal, but over time breaks can occur in the shielding. These breaks may permit signals to radiate wirelessly from the wired line, and/or wireless signals in the vicinity of the leak may enter the wired line and interfere with the signal carried therein. As described herein, such breaks may be detected using a mobile device that comprises a wireless radio. A diagnostic signal may be injected into the wired network, and the mobile device may be used to determine if the diagnostic signal leaks from the wired network.

The communication network may comprise the TS 104, a radio signal transmitter 124 (e.g., a frequency modulation (FM) transmitter), a wired network node 302, and wire lines (e.g., coaxial cable lines) connected to a plurality of premises 102 (e.g., premises 102a and 102b). The TS 104 may comprise or communicate with the diagnostic server 122 (e.g., shown in FIG. 1). The TS 104, the diagnostic server 122, and/or other computing device of the local office 103 may control the radio signal transmitter 124 to inject a diagnostic signal (e.g., a diagnostic radio signal) into one or more of the wired lines. For example, one or more network components (e.g., splitters, optical nodes, amplifiers, filters, etc.) of the communication network may be used to transfer a diagnostic radio signal from the radio signal transmitter 124 to a particular premises (e.g., the premises 102b). The diagnostic radio signal may comprise a diagnostic FM signal (e.g., having a carrier frequency between 108-137 MHz or a carrier frequency of other frequency ranges). The diagnostic radio signal may comprise a stabilized clock signal and indicate timing information of the diagnostic radio signal. The wired network node 302 may comprise splitters, optical links, optical nodes, amplifiers, filters, etc. (e.g., to transfer a particular diagnostic radio signal to an intended destination, such as the premises 102b). Although not shown in FIG. 3, one or more diagnostic radio signal transmitters 124 may be connected between the wired network node 302 and one or more of the premises 102.

The diagnostic radio signal may travel via one or more of the wired lines. A radio signal leakage 311 may occur at one or more points of the wired lines (e.g., a point where the shielding defects of the wired lines exist). The shielding defects may deteriorate the communication quality of the wired network and may cause interferences. For example, radio signals and/or wireless signals may enter into the wired network (signal ingress) and may interfere with the wired communication signals. The signal leakage from the communication network may also cause problems. The signals leaked from the wired networks may escape (signal egress) and interfere with radio signals and wireless signals at the same or similar frequencies, and can also result in a degraded signal on the wired network. For example, the signal egress may disrupt cellular mobile communication signals (e.g., LTE data transmissions). Some regulatory agencies (e.g., the Federal Communications Commission) impose requirements to manage such problems. For example, the Federal Communications commission mandates all cable operators to routinely identify and repair any cable leakage measured to be greater than a certain signal power. However, for wire network operators, it may be costly to regularly test and fix network defects to avoid and/or reduce such signal ingress and signal egress. For example, hiring and training technicians, maintaining and updating test equipment for a wide area of networks, and manually updating the test results by the technicians may be inefficient and costly.

One or more signals comprising the diagnostic radio signal may be transmitted via the wired network, and a portion of the diagnostic radio signal may leak as a wireless signal (e.g., through the shielding defects). That portion may comprise a modified or distorted version of the original diagnostic signal that was sent via the wired network. The portion may comprise the full signal, depending on the signal, wire, and/or leakage characteristics.

Mobile devices (e.g., smart phones) are often equipped with an embedded FM (frequency modulation radio) tuner. The FM tuner of the mobile devices 125 (e.g., mobile devices 125a, 125b, 125c, and 125e) are often deactivated by default, but may be conditionally activated to measure the radio signal leakage 311 and may serve as leakage detectors. The activation of the FM tuner may be temporary and may be controlled by the operator of the wired network and/or the operator of a cellular mobile communication network associated with the mobile devices 125. A computing device of the wired network may send a request signal to a computing device of the cellular mobile communication network so that the computing device of the cellular mobile communication network may temporarily activate the FM tuner of one or more of the mobile devices 125. The computing device of the cellular mobile communication network may send a wireless signal to one or more mobile devices 125 to temporarily activate the FM tuner of the one or more mobile devices 125.

The computing device of the wired network may send, to the one or more mobile devices 125, a signal indicating details of a diagnostic radio signal that will be transmitted via the wired network, so the mobile device 125 will know what kind of wireless signal to be looking for. The details of the diagnostic radio signal may comprise, but is not limited to, a modulation frequency of the radio signal, a pseudo random code used in generating the diagnostic radio signal, transmission time information of the diagnostic radio signal, and/or other characteristics of the diagnostic radio signal. The one or more mobile devices 125 may prepare to wirelessly detect the diagnostic radio signal (e.g., at least a portion of the diagnostic radio signal leaked from the wired network), for example, based on the signal indicating information of the diagnostic radio signal. The preparation may comprise activation of a radio signal detector (e.g., an FM Tuner equipped in a cellular phone) to test whether the diagnostic radio signal is detected by the one or more mobile devices 125. The one or more mobile devices 125 may or may not receive, via the activated radio signal detector, the diagnostic radio signal. The one or more mobile devices 125 may not receive the diagnostic radio signal, for example, if there is no shielding defects around the area in which the one or more mobile devices 125 are located. The one or more mobile devices 125 may receive the diagnostic radio signal and may estimate the direction and/or strength of the diagnostic radio signal. The one or more mobile devices 125 may determine that the diagnostic radio signal is output from the wire lines by the radio signal leakage 311, for example, based on the estimated direction and/or strength, the modulation frequency, the pseudo random code used for the diagnostic radio signal, the transmission time information, and/or other characteristics of the diagnostic radio signal.

A plurality of mobile devices may simultaneously or non-simultaneously measure the signal strength of at least a portion of the diagnostic radio signal and may determine (e.g., based on the TDOA) the location of the radio signal leakage 311. The location of the diagnostic radio signal leakage 311 may be more accurately measured by using the measurements of the plurality of mobile devices (e.g., in comparison with a location estimation by a measurement of a single mobile device). For example, GPS locations of the mobile devices 125a, 125b, 125c, and 125e and time difference of arrival (TDOA) may be used to predict and/or determine the location of the radio signal leakage 311. The mobile device 125a may detect the diagnostic radio signal quicker than the mobile device 125e because the mobile device 125a is located closer to the radio signal leakage 311. Also, the received signal power of the diagnostic radio signal measured by the mobile device 125a may be greater than the received signal power of the diagnostic radio signal measured by the mobile device 125e because the mobile device 125a is located closer to the radio signal leakage 311.

The measurements may be performed based on various factors, such as a type of the premises, a status of a mobile device, etc. The measurements may be performed without sending a technician to the premises 102b and may be performed during nighttime while mobile device users are within or around the premises 102. The measurements may be performed during business hours, for example, if the leak testing is performed around business offices. FM signal measurements may be performed based on one or more parameters of a mobile device (e.g., a battery level of a mobile device, a connection of a mobile device to a charger, a location of a mobile device in a premises, etc.). The measurements may be performed while the mobile devices 125 are connected to a charger or the battery level of a mobile device is greater than a threshold level.

The mobile devices 125 may send, to the computing device of the wired network, a report comprising the measurement results and the GPS location of the mobile devices 125. The report may be communicated to the computing device of the wired network via a Wi-Fi network or via a cellular mobile communication network. The computing device of the wired network may comprise or may communicate with the diagnostic server 122 to diagnose the network problem, such as the radio signal leakage 311.

Figure 4:
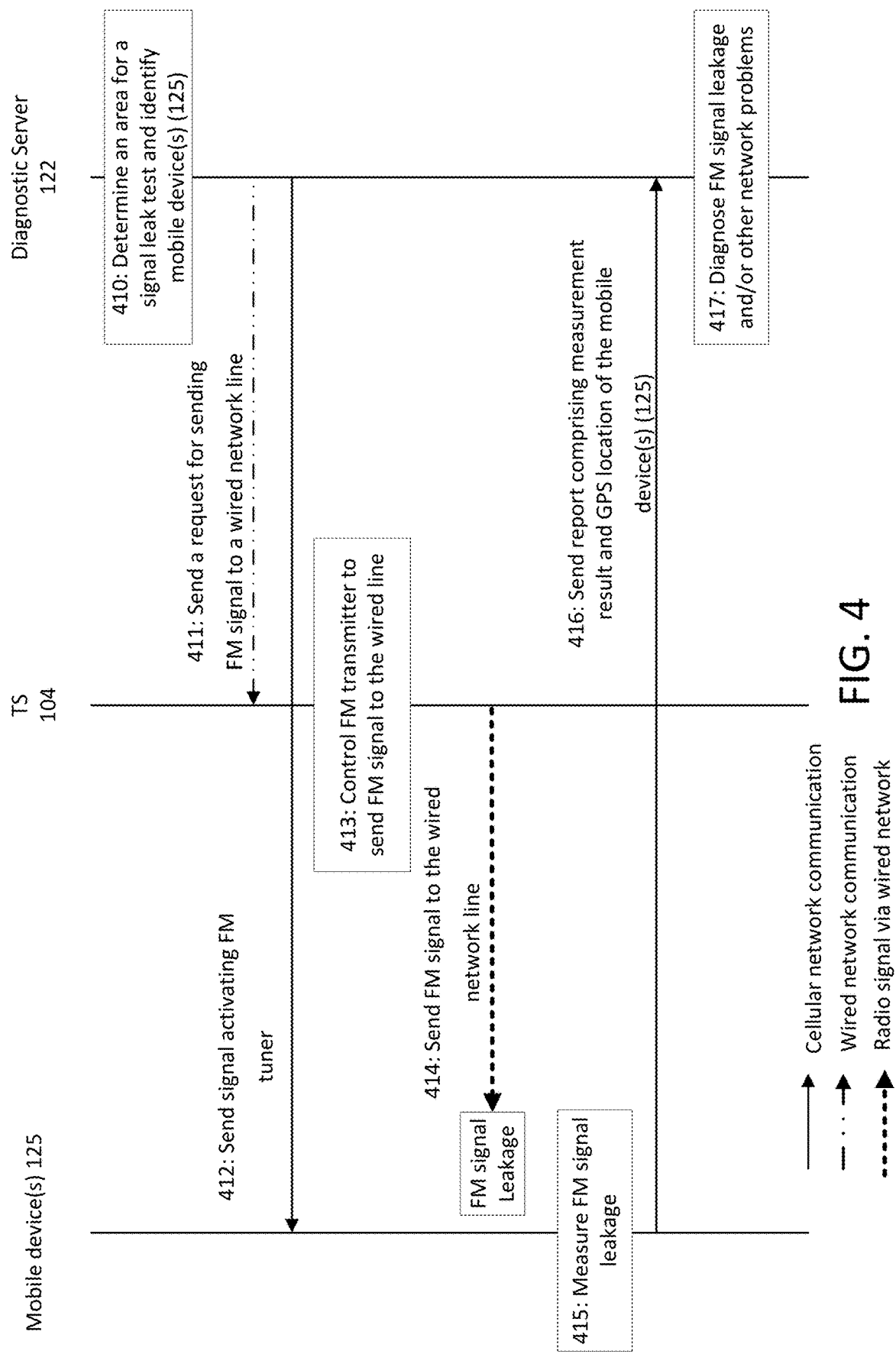
FIG. 4 shows an example signaling diagram for controlling a mobile device to detect a diagnostic radio signal.

FIG. 4 shows an example signaling diagram for controlling a mobile device to detect a diagnostic radio signal. Some or all steps shown in FIG. 4 may be performed by one or more computing devices (e.g., the diagnostic server 122, the TS 104, and the mobile device(s) 125) or other computing devices or network components. One or more steps may be added, omitted, and/or rearranged. At step 410, the diagnostic server 122 may determine an area (e.g., an area around the premises 102b shown in FIG. 3) for a signal leak test. The diagnostic server 122 may periodically perform a signal leak test for each area and may update a network status of each area. For example, the diagnostic server 122 may divide a certain geographic area into a plurality of zones (e.g., 100 zones in the area having ZIP code 20001-0001), and may select one of the plurality of zones for the signal leak test. The diagnostic server 122 may identify one or more mobile device(s) 125 located in a selected area (e.g., the selected zone). The diagnostic server 122 may collect GPS location data of a plurality of mobile devices 125 to identify the one or more mobile devices 125 located in the selected area.

A user of the wired network may report, to the wired network operator, a network problem (e.g., via a call using his/her mobile device 125 or via an application installed on the mobile device 125). The diagnostic server 122 may select the area in which the mobile device 125 that reported the network problem ("a reporting mobile device") is located. The diagnostic server 122 may identify the household information of the reporting mobile device and may identify one or more mobile devices 125 of a family (e.g., members of the immediate family or other individuals included in the user's profile of the wired/wireless network services). Additionally, or alternatively, the reporting mobile device may provide the diagnostic server 122 with information of one or more additional mobile devices (e.g., mobile phone numbers of family members). The diagnostic server 122 may additionally identify one or more mobile devices 125 in the neighborhood. The diagnostic server 122 may look up previous signal leak measurement reports and/or subscriber information of the wired network to determine one or more mobile devices reside in the selected area.

At step 411, the diagnostic server 122 may send, to a TS 104 managing the wired network of the selected area, a request for sending a diagnostic FM signal, via the wired network, on one or more wired lines in selected area. The diagnostic FM signal may be forwarded by one or more network elements of the wired network so that the diagnostic FM signal can propagate via the one or more wired lines in the selected area. The diagnostic server 122 may communicate with the TS 104 via a wired connection (e.g., a cable network connection, an HFC network connection, etc.). At step 412, the diagnostic server 122 may send, to one or more mobile devices 125, a signal activating an FM tuner of the one or more selected mobile devices 125 identified at step 410. The diagnostic server 122 may communicate with the one or more mobile devices 125 via a base station of a cellular mobile communication network. The signal activating an FM tuner of the one or more selected mobile devices 125 may temporarily activate the FM tuner of the one or more mobile devices 125 so that the one or more mobile devices 125 may measure a diagnostic FM signal in the selected area.

At step 413, the TS 104 may control an FM transmitter to send a diagnostic FM signal on the one or more wired lines in the selected area. For example, the TS 104 may control the FM transmitter, one or more optical links, one or more optical nodes, one or more amplifiers, one or more filters, etc. so that the diagnostic FM signal travels via the wired network and reaches the one or more wired lines in the selected area. At step 414, the FM transmitter may send, to the one or more wired lines, the diagnostic FM signal. The diagnostic FM signal used for the leak testing may use a unique FM modulation frequency and/or a unique pseudo random code so that the diagnostic FM signal can be distinguished from other FM signals for various services (e.g., other FM signals for music broadcasting, news broadcasting, etc.). The diagnostic FM signal may be leaked at a portion of the one or more wired lines (e.g., the radio signal leakage 311). At step 415, the one or more mobile device(s) 125 located in the selected area may receive, by using the activated FM tuner(s), the leaked diagnostic FM signal. At step 416, the one or more mobile devices 125 may send, to the diagnostic server 122 and via the cellular mobile communication network, a report comprising measurement results and the GPS location of the one or more mobile device(s) 125. Each of the reports may also comprise a parameter indicating the direction of the leak source. At step 417, the diagnostic server 122 may receive one or more reports from the one or more mobile device(s) 125 and may diagnose the network status (e.g., one or more locations of the FM signal leakage and/or other network problems).

Figure 5:
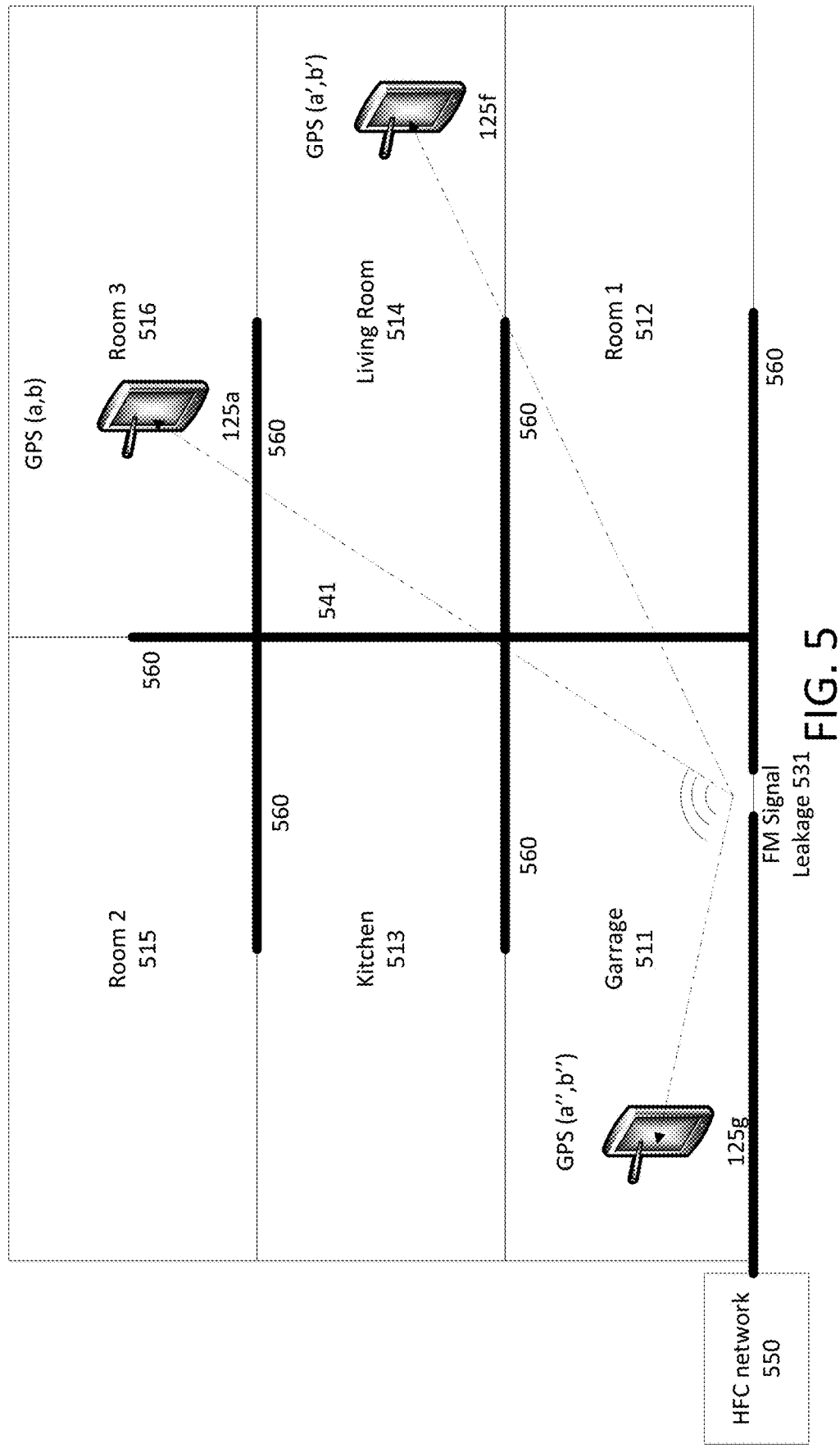
FIG. 5 shows an example of detecting a diagnostic frequency modulation (FM) signal leakage using a plurality of mobile devices located in a premises.

FIG. 5 shows an example of detecting a diagnostic FM signal leakage using a plurality of mobile devices located in a premises 102c. The owners of the mobile devices 125a, 125f, and 125g may reside in the premises 102c. The mobile devices 125a, 125f, and 125g may communicate with a cellular mobile communication network operated by a cellular mobile communication network operator. The premises 102c may be connected to an HFC network 550 operated by a wired network operator. The HFC network 550 may provide one or more coaxial cable lines 560 to the premises 102c. The one or more coaxial cable lines 560 may have a shielding defect that causes an FM signal leakage 531. The wired network operator may maintain a list of users (e.g., subscribers) for their services, and may maintain profile information of the users (e.g., mobile telephone numbers, mobile phone types, home addresses, etc.). A computing device (e.g., the diagnostic server 122) of the wired network operator may receive location information of the mobile devices 125a, 125f, and 125g. For example, the computing device of the wired network operator may receive, from the mobile devices 125a, 125f, and 125g via a cellular mobile communication (or a Wi-Fi connection), the location information of the mobile devices 125a, 125f, and 125g. The Wi-Fi connection may be provided via a wireless router connected to the one or more coaxial cable lines 560. The mobile devices 125a, 125f, and 125g may communicate with the wireless router of the premises 102c to communicate with the computing device of the wired network operator. The communication via the Wi-Fi connection may indicate that the mobile devices 125a, 125f, and 125g are located in proximity of the wireless router of the premises 102c but may provide approximate location information of each of the mobile devices 125a, 125f, and 125g. The computing device of the wired network provider may receive the GPS location data of the mobile devices 125a, 125f, and 125g (e.g., from the mobile devices 125a, 125f, and 125g or via a computing device of the cellular mobile communication network operator). An application installed on the mobile devices 125a, 125f, and 125g may cause the mobile devices 125a, 125f, and 125g to communicate with the computing device of the wired network operator to provide the GPS location data of the mobile devices 125a, 125f, and 125g.

The mobile device 125a may have first GPS location data indicating (latitude=a, longitude=b). The mobile device 125f may have second GPS location data indicating (latitude=a', longitude=b'). The mobile device 125g may have third GPS location data indicating (latitude=a", longitude=b"). Additional measurements by one or more mobile devices in addition to the mobile devices 125a, 125f, and 125g may enhance the accuracy of determining the location of the leak source, for example, if the mobile devices 125a, 125f, and 125g are located in the premises 102c. Depending on the locations of identified mobile devices for a leak testing, it may be determined whether to identify additional mobile devices to increase the accuracy of the leak testing.

In order to cause the mobile devices 125a, 125f, and 125g to receive and measure a diagnostic FM signal from the shielding defect and determine the direction of the received diagnostic FM signals, the diagnostic server 122 may send, to the mobile devices 125a, 125f, and 125g, a request signal for moving or rotating the mobile devices 125a, 125f, and 125g. The request signal may cause the mobile devices 125a, 125f, and 125g to output user instructions. The user instructions may request the users of the mobile devices 125a, 125f, and 125g to move and/or rotate the mobile devices 125a, 125f, and 125g. FM tuners of the mobile devices 125a, 125f, and 125g may receive and measure the diagnostic FM signals while the mobile devices 125a, 125f, and 125g are moving and/or rotating.

The moving and/or rotating of the mobile devices 125a, 125f, and 125g while receiving the diagnostic FM signals may enable the mobile devices 125a, 125f, and 125g to determine the direction of the received diagnostic FM signals. One or more sensors (e.g., accelerometer, gyroscope, etc.) of the mobile devices 125a, 125f, and 125g may determine directional parameters (e.g., the orientation and acceleration of the mobile devices 125a, 125f, and 125g). For example, accelerometers in the mobile devices 125a, 125f, and 125g may be used to detect the orientation and tilt of the mobile devices 125a, 125f, and 125g. The accelerometers may measure linear acceleration of movement (e.g., in three-dimensional directions). Gyroscopes of the mobile devices 125a, 125f, and 125g may add an additional dimension to the information supplied by the accelerometers by tracking rotation or twist of the mobile devices 125a, 125f, and 125g. The gyroscopes may measure the angular velocity and the rate of the angular velocity change (e.g., an angular acceleration). Digital compasses (e.g., magnetometers) of the mobile devices 125a, 125f, and 125g may provide the orientation of the mobile devices 125a, 125f, and 125g in relation to the Earth's magnetic field. The mobile devices 125a, 125f, and 125g may, based on the physical orientation of the mobile devices 125a, 125f, and 125g, auto rotate a digital map displayed on the mobile devices 125a, 125f, and 125g. The auto rotation of the digital map, which will be further described below, may facilitate the users of the mobile devices 125a, 125f, and 125g to know the direction of the FM signal leak source by looking at the digital map. Barometers of the mobile devices 125a, 125f, and 125g may assist the GPS chips equipped in the mobile devices 125a, 125f, and 125g by delivering altitude data. The barometers may assist the mobile devices 125a, 125f, and 125g to determine what floor the users are on within the premises 102c.

Figure 6:
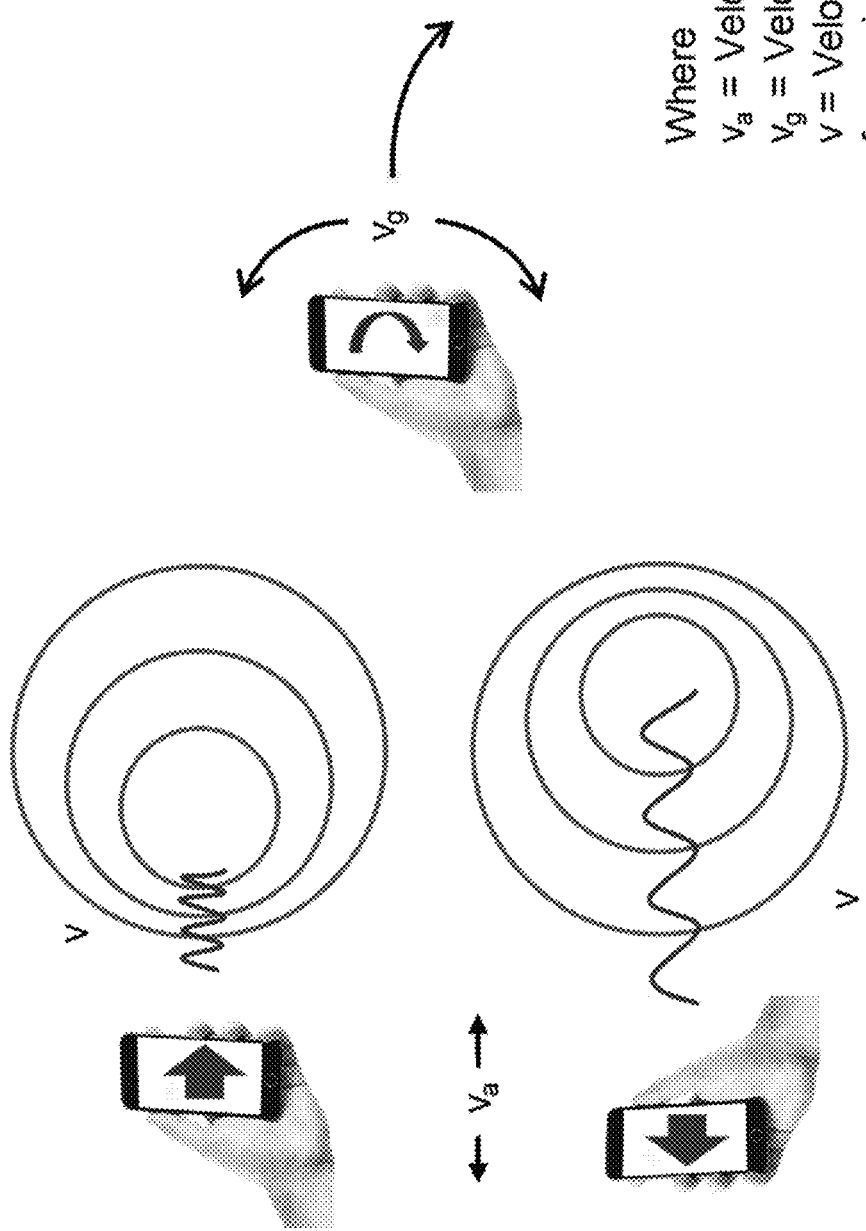
FIG. 6 shows an example of instructing a user to move and/or rotate a mobile device to apply a Doppler shift effect in estimating a leak location.

FIG. 6 shows an example of instructing a user to move and/or rotate a mobile device to apply a Doppler shift effect in estimating a leak location. A mobile device may receive a wireless signal that instructs the user to move and/or rotate the mobile device. The mobile device may output the instructions (e.g., display a message, output an audible message to inform the user of the instructions). An activated radio signal receiver of the mobile device may detect the diagnostic radio signal while the mobile device is moving and/or rotating. The mobile devices 125a, 125f, and 125g may measure changes of an apparent frequency (or an observed frequency) of the received diagnostic FM signals by analyzing a linear Doppler shift and/or an angular Doppler shift. An actual frequency f may be used for generating the diagnostic FM signal. The actual frequency f may be a carrier frequency of the diagnostic FM signal. The diagnostic FM signal may be received by a mobile device and an apparent frequency f' of the received diagnostic FM signal may be determined by the mobile device. If the mobile device is moving toward the leak source with a velocity Va, the apparent frequency f' may be calculated as $$f' = \frac{(v + v_a)}{v} f,$$

where v is a velocity of a diagnostic FM signal leaked from a wired line. If the mobile device is moving away from the leak source with the velocity Va, the apparent frequency f' may be calculated as $$f' = \frac{(v - v_a)}{v} f,$$

where v is a velocity of a diagnostic FM signal leaked from a wired line. The angular velocity Vg and/or an angular acceleration may be measured by the gyroscopes and may be used to correct errors that may be caused by an antenna rotation.

One or more mobile devices may comprise one or more inertial measurement units (IMUs) (e.g., low-cost inertial measurement sensors for mass market needs), which may be used to correct the measurements. The IMUs may lack sufficient accuracy and speed to accommodate complex operations. One or more inertial measurement algorithms and/or measurement filtering may be used to address measurement inaccuracies. Temperature, non-gravitational acceleration, and other motion anomalies, such as vibration, may cause unwanted errors in the FM signal measurement. A compensation, calibration, and/or normalization may be performed to improve the accuracy of the IMUs, thereby accurately implementing the linear Doppler Effect and/or the angular Doppler Effect. For example, a mobile device may initialize the IMUs, calibrate IMUs based on a magnetometer, obtain gyroscopic samples for Yaw, Pitch, and Roll (Y, P, R), normalize (Y, P, R) measurements for a continuous rotation of the mobile device, obtain accelerometer samples for X, Y, and Z axes, and calculate an angular velocity and/or an angular acceleration.

A mobile device may interrupt or delay the performance of a diagnostic FM signal measurement and/or the activation of an FM tuner, for example, a battery level is below a threshold battery level. A mobile device may perform an FM signal measurement without utilizing the Doppler Effect, for example, if the mobile device is connected to a charger or if the FM signal measurement is performed while the mobile device is in a sleep mode (e.g., a user is not using the mobile device).

The operator of the wired network may provide one or more configurations to cause the mobile device users to move and/or rotate their mobile devices. One or more incentives and/or rewards may be provided to the users if the user moves and/or rotate their mobile devices in a particular time period and/or if the user agrees to provide one or more measurement reports after measuring an FM signal using his/her mobile device. The mobile device users may receive digital currency, points, other benefits (e.g., a free rental of a movie), etc.

Figure 7:
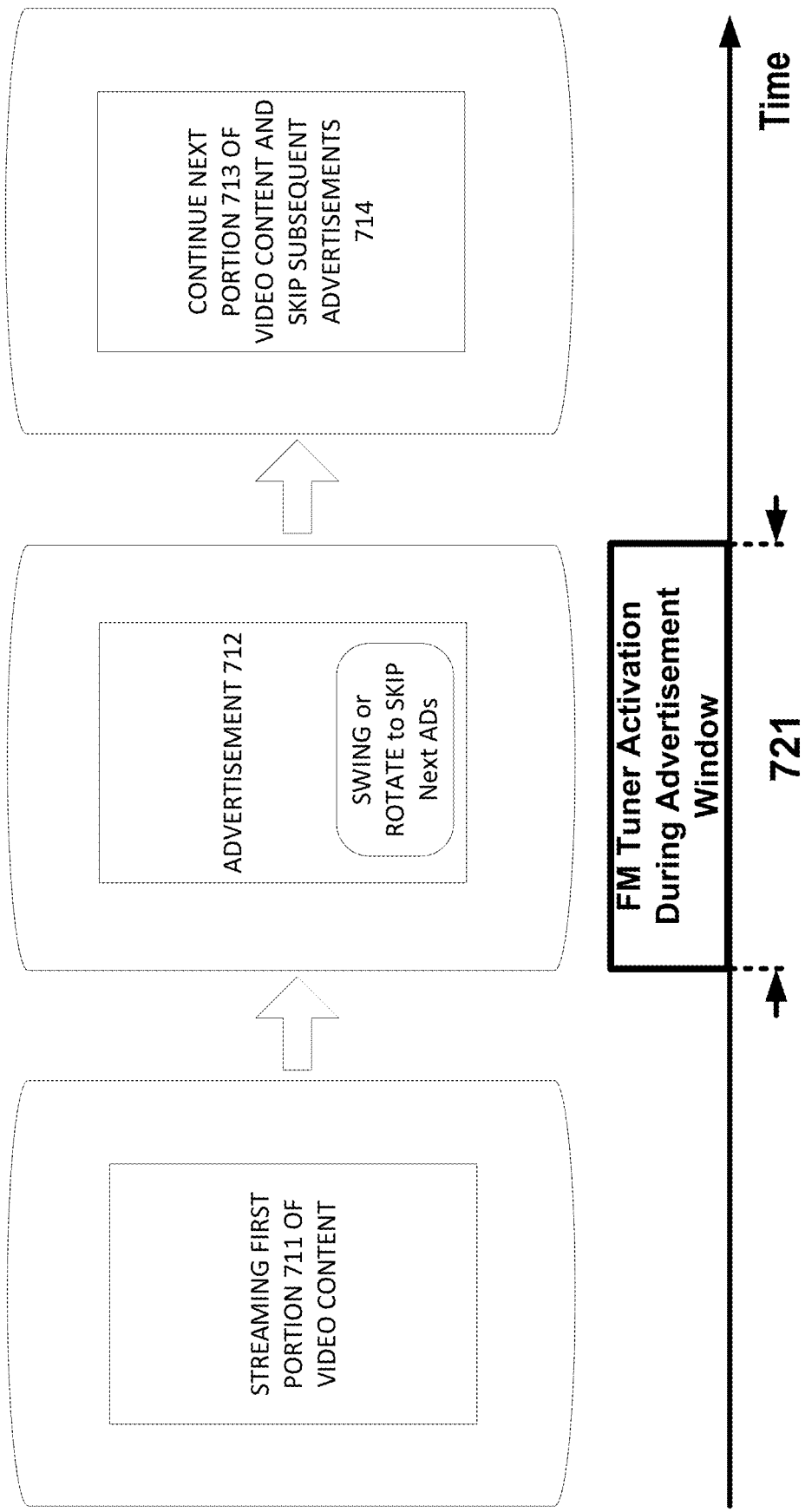
FIG. 7 shows an example of encouraging mobile device users to participating in a signal leak test.

FIG. 7 shows an example of encouraging mobile device users to participate in a signal leak test. A wired network service provider, that may also operate other networks such as wireless networks, may provide various incentives and/or rewards to mobile device users, for example, if the mobile device users move and/or rotate their mobile devices while the mobile devices are detecting a diagnostic radio signal. The wired network service provider may provide incentives, such as free movies, upgraded communication speed, free Wi-Fi access, advertisement-free contents, discounted payment plan, etc. A user of the mobile device 125a may consume video content using the mobile device 125a. The video content may be provided by the operator of the wired network or an entity affiliated with the operator of the wired network. After streaming a first portion 711 of the video content, an advertisement 712 may be output by the mobile device 125a. While outputting the advertisement 712, the mobile device 125a may output a message (e.g., "Swing or rotate your mobile device to skip next advertisement") to cause the user of the mobile device 125a to move and/or rotate the mobile device 125a. The FM tuner of the mobile device 125a may be activated during the advertisement window (e.g., for 30 seconds length of the advertisement 712). The user of the mobile device 125a may move and/or rotate, based on the message, the mobile device 125a, for example, if the user of the mobile device 125a is not interested in the advertisement 712 and/or subsequent advertisements 714 scheduled in the streaming of the video content. The mobile device 125a may receive a diagnostic FM signal (e.g., from the FM signal leakage 531) while the user is moving and/or rotating the mobile device 125a during the advertisement window. The mobile device may determine the direction 541 of the FM signal leakage 531 by using data obtained from one or more internal components of the mobile device 125a (e.g., an FM tuner, an accelerometer, a gyroscope, a barometer, etc.). The mobile device 125a may send, to a computing device of the operator of the wired network (e.g., the diagnostic server 122), a report comprising information of the direction 541, a received signal power of the diagnostic FM signal, the altitude measured by the mobile device 125a (e.g., the third floor of the premises 102c), the address of the premises, etc. The report may also comprise information of the GPS location data (latitude=a, longitude=b) of the mobile device 125a. The mobile devices 125f and 125g may perform similar operations and may send similar reports to the computing device of the operator of the wired network. The computing device of the operator of the wired network may update a database (e.g., a leak measurement database) based on the reports from one or more of the mobile devices 125a, 125f, and 125g. An FM signal leakage may be tested for each of a plurality of areas without sending technicians to the premises.

Figure 8:
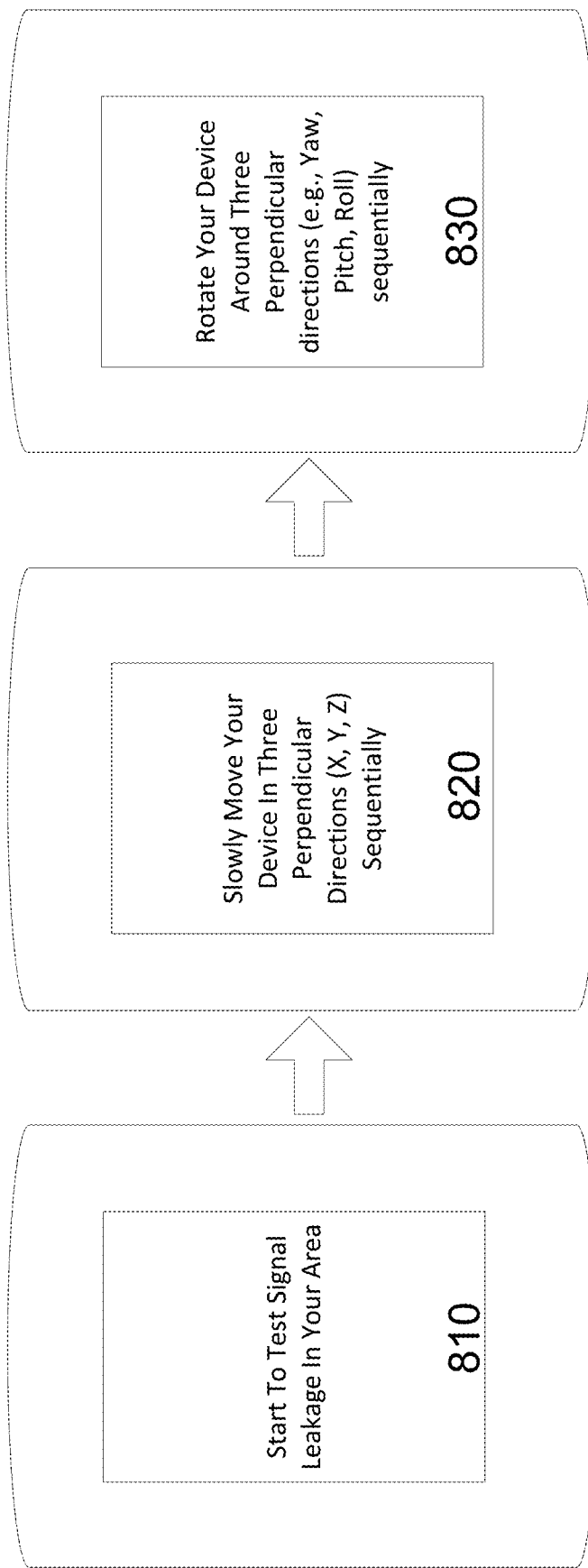
FIG. 8 shows an example user interface of a mobile device to instruct a user to move and/or rotate the mobile device.

FIG. 8 shows an example user interface of a mobile device to instruct a user to move and/or rotate the mobile device. The mobile device may detect a diagnostic radio signal while moving and/or rotating and may estimate a direction of the detected diagnostic radio signal, for example, based on accelerometer data and/or gyroscope data. An application (e.g., a content streaming app, a network management app, a leak testing app, etc.) associated with the operator of the wired network may be installed on the mobile device. A single application may provide a plurality of features, such as the content streaming and the leak testing. The one or more mobile devices 125 may install an application associated with the operator of the wired network, and the application may enable the operation of the conditional activation of the FM tuner. The mobile device may perform a diagnostic radio signal measurement while the application is executed. The user of the mobile device may experience a communication problem (e.g., a degradation of communication quality, a network error, a delayed network response, etc.) of the wired network and may report the communication problem to the operator of the wired network. The user may make a phone call using the mobile device or send a message using the application of the mobile device to make a complaint report, and the operator of the wired network may identify a user associated with the complaint report. The operator of the wired network may retrieve the profile information of the user based on the call or the message for the complaint report. A computing device of the wired network operator may communicate with the mobile device and may cause the application of the mobile device to perform a diagnostic radio signal leakage detection. The application of the mobile device may provide a user interface showing the performance of the diagnostic radio signal leakage detection. The mobile device may display a screen 810 indicating the initiation of the signal leakage detection. The computing device of the wired network operator may send, to the mobile device, an activation signal to activate a radio signal receiver (e.g., an FM tuner) of the mobile device and to test the signal leakage around the mobile device.

The mobile device may output a screen 820 comprising a message instructing the user of the mobile device to move the mobile device (e.g., "Slowly move your device from left to right"). The FM tuner of the mobile device may be activated, and the mobile device may monitor a diagnostic radio signal, for example, if the screen 820 is output. The user of the mobile device may move (e.g., slowly swing) the mobile device in one of three perpendicular directions (e.g., X, Y, Z axes) and move the mobile device in another one of three perpendicular directions according to the instructions shown on the screen 820. The movement of the mobile device may be a sweeping motion while searching for the FM leakage. For example, according to the instructions output on the screen 820, the use may slowly swing the mobile device from left to right (e.g., along the X axis), swing the mobile device away from the front of the user (e.g., along the Y axis), and swing the mobile device from down to up (e.g., along the Z axis). The diagnostic radio signal may be received while the mobile device is moving. The mobile device may output a screen 830 comprising a message instructing the user of the mobile device to rotate and/or swing the mobile device (e.g., "Rotate your device around three perpendicular directions (Yaw, Pitch, Roll) sequentially"). The mobile device may detect a diagnostic radio signal, for example, if the screen 830 is output. The user of the mobile device may rotate the mobile device in three rotational directions according to the instructions shown on the screen 830. The diagnostic radio signal may be received while the mobile device is rotating. Visual and/or audible instructions may be output to assist the user to understand the instructions of the messages. The output of the screen 820 and/or screen 830 may be caused by the computing device of the wired network operator to gather more accurate information about the leakage source (e.g., the direction of an FM signal from the FM signal leakage 531 to the location of the mobile device 125g).

Some mobile devices may comprise an integrated FM antenna, and some other mobile devices may not comprise an integrated FM antenna. For mobile devices that do not comprise an integrated FM antenna, an external FM antenna may be attached or a connectible cord (e.g., a headphone cord, an earphone cord, etc.) may be attached to serve as an external FM antenna. The Doppler implementation described herein may be used if a mobile device comprise an integrated FM antenna or an external FM antenna. The integrated FM antenna or the external FM antenna may be positioned relative to the position of the mobile device. By moving and/or rotating the mobile device, the orientation of the integrated FM antenna or the external FM antenna may be measured based on the Doppler implementation described herein. The measured orientation of the antenna may be used in determining the direction of the received FM signal.

A mobile device or a computing device communicating with the mobile device may determine whether the mobile device comprises an integrated FM antenna. Various information (e.g., a model, a type, etc.) of the mobile device may be identified to determine whether the mobile device comprises an integrated FM antenna. If the mobile device does not comprise an integrated antenna, it may be determined whether an external FM antenna or a connectible cord is connected to the mobile device. For example, the mobile device may detect whether the connectible cord or an external FM antenna is connected to its connecting part (e.g., a headphone jack). As such, a test routine may be implemented to determine if an antenna is likely to be positioned relative to the orientation of the mobile device. The Doppler implementation described herein may be selectively operated depending on a determination whether an antenna is likely to be positioned to the orientation of the mobile device.

Figure 9:
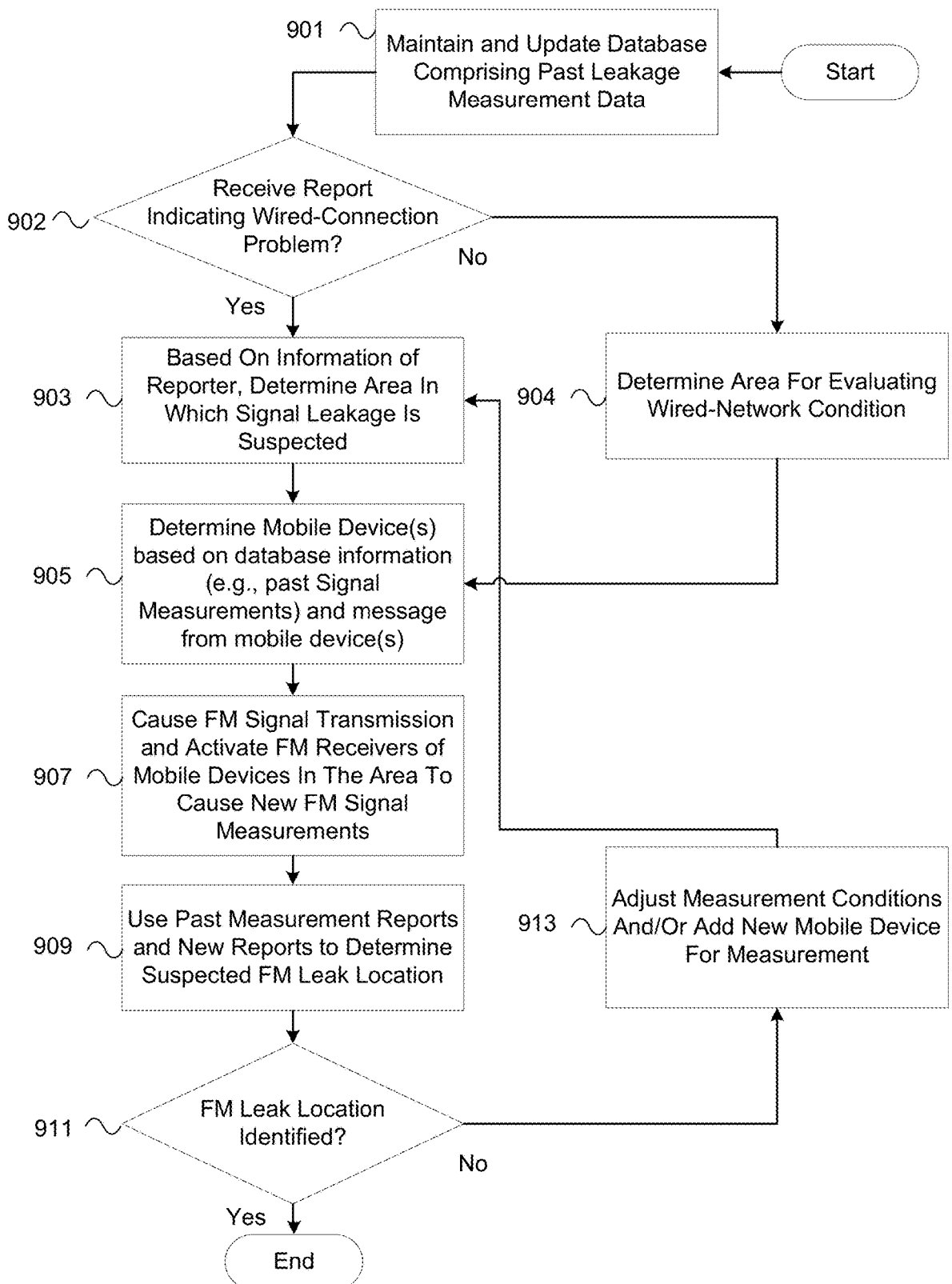
FIG. 9 shows an example method for controlling a mobile device to test a leakage and update a leak measurement database.

FIG. 9 shows an example method for controlling a mobile device to test a leakage and update a leak measurement database. A computing device (e.g., the diagnostic server 122, the computing device 200, etc.) may perform the operations shown in FIG. 9. Some or all steps shown in FIG. 9 may also or alternatively be performed by one or more other computing devices (e.g., the TS 104, a server communicating with a mobile device and/or with a termination system, etc.). One or more steps may be added, omitted, and/or rearranged. At step 901, a database comprising past leakage measurement data (e.g., data entries in Tables 1 and 2 described below) may be maintained. At step 902, it may be determined whether a report indicating a wired-connection problem is received. For example, the computing device may receive the report from a user of a wired-network (e.g., an HFC network). A network operator of the wired-network may receive a mobile communication signal (e.g., a phone call, a text message, a mobile data communication, etc.) from a mobile device of the user. The computing device may identify, based on the received communication, an identifier (e.g., the mobile device ID) of the mobile device. The computing device may identify, based on subscription information associated with the identifier of the mobile device, a service profile associated with the user of the mobile device. For example, the service profile may comprise information indicating whether the user of the mobile device is a user of one or more wired-network services (e.g., wired-communication services, cable TV services, etc.) of the network operator. The computing device may determine, based on the subscription information, an identifier of one or more other mobile devices, such as mobile phone numbers of the user's family, mobile phone numbers of the user's neighbor, etc.

At step 903, an area in which a signal leakage is suspected may be determined, for example, based on information of the report (e.g., the service profile associated with the user). An address of the user to which the one or more wired-network services are provided may be retrieved. The mobile device may send information of the current location (e.g., GPS location) of the mobile device. Based on the address and/or the current location of the mobile device, the area in which a signal leakage is suspected may be determined.

At step 904, an area for evaluating a wired-network condition may be determined, for example, if a report indicating a wired-connection problem has not been received. The measurement data of each zone of the leak measurement database may be updated (e.g., periodically). For example, step 904 may be performed one or more times for each determined area. The leakage measurement data stored in the leak measurement database may be analyzed periodically. With respect to each zone, it may be checked whether the measurement data is up-to-date and whether more than a certain quantity of measurement data have been stored (e.g., one new measurement per day, ten new measurements per week, etc.). For example, the measurement time and date of each measurement entry may be analyzed to determine whether that measurement entry is up-to-date. The one or more new measurements may be initiated, for example, if it is determined that an updated measurement is necessary.

At step 905, past FM signal measurements made in the area in which the signal leakage is suspected may be collected. Based on the area and the past FM signal measurements, an identifier of one or more mobile devices that performed the past measurements may be identified. One or more past measurement data entries associated with the area may be retrieved from the leak measurement database to select candidate mobile devices for the new measurements. It may be determined whether the one or more mobile devices that performed the past measurements are currently located within the area by communicating with the identified mobile device(s). For example, the computing device may send a message inquiring whether the mobile device(s) are available for a diagnostic radio signal measurement in the area. At step 907, a signal may be sent to cause the identified mobile device(s) to activate an FM receiver of the identified mobile device(s) and to cause the identified mobile device(s) to measure a diagnostic FM signal. One or more measurement reports may be received from the identified mobile device(s), for example, if the identified mobile device(s) are located in the area. One or more mobile devices of the identified mobile device(s) may not respond, for example, if the one or more mobile devices are not located in the area and/or not available for a diagnostic radio signal measurement (e.g., having a low battery level). The identified mobile device(s) may comprise the mobile device that reports the wired-connection problem. The mobile devices may comprise one or more mobile devices of the reporter and one or more mobile devices of neighbors of the reporter (e.g., neighbors residing in premises adjacent to the premises of the reporter). One or more mobile devices may be determined as candidate mobile devices to test a signal leakage in the area, for example, based on their locations in proximity to a portion of the wired network in the area. The one or more mobile devices may be located in proximity to the portion of the wired network in the area, for example, if the one or more mobile devices are within a distance (e.g., 100 feet) from the portion of the wired network.

The received one or more measurement reports may be analyzed together with the retrieved one or more measurement data entries. One or more measurements reports may be received from one or more mobile devices that belong to the same household. Additional location information and/or additional directional information may be necessary in addition to the received measurements reports to more accurately determine a leakage point based on the TDOA, for example, because the mobile devices that belong to the same household may be located in the same location (e.g., in the same bedroom). At step 909, the existing past measurement reports (e.g., the retrieved one or more measurement data entries) and the new reports (e.g., the received one or more measurement reports) may be used in combination, or the new reports may be used alone, to determine a suspected FM leak location. From the past measurement data, one or more measurements from one or more neighbors (e.g., reported a few days ago) may be retrieved and combined with the new measurement reports. The past measurement data and the new measurement reports may be used to more accurately estimate the leakage point in the area, for example, based on the TDOA method. At step 911, it may be determined whether an FM leak location is identified. Information about the suspected FM leak location may be sent to the identified mobile device(s) or other devices so that the FM leakage may be timely addressed, for example, if the suspected FM leak location is identified.

At step 913, measurement conditions may be adjusted and/or new mobile device(s) may be added for a subsequent FM leak measurement, for example, if the FM leak location needs to be estimated more accurately. For example, measurement report(s) received from less than a threshold number of mobile devices (e.g., one mobile device) may not be enough to determine the suspected leakage point accurately. To gather more measurement data from different measuring locations, more mobile devices in the location may be identified to receive additional measurement reports. For example, the computing device may request one or more mobile devices to send new measurements reports by moving and/or rotating their mobile devices. The step 903 may be repeated, for example, after adjusting the measurement conditions and/or adding new mobile device(s). The computing device may cause measurement condition adjustment(s), for example, if the computing device determines that an FM leak location is not identified or is determined inaccurately. The measurement condition adjustments may comprise identifying one or more additional mobile devices in the area, causing activation of FM receivers of the one or more additional mobile devices, and causing the one or more additional mobile devices to perform an FM signal leak measurement. The measurement condition adjustments may comprise changing one or more parameters (e.g., signal strength, a modulation scheme, a coding scheme, etc.) of an FM signal sent to the particular address via a wired-communication network. At step 911, it may be determined whether the FM leak location is identified. The computing device may cause deactivation of the FM receivers of the mobile devices, for example, if the computing device determines that the FM leak location is identified.

The measurement entries of each zone of the leak measurement database may be updated. Step 901 and one or more subsequent steps may be performed one or more times for each determined area (e.g., periodically). One or more of steps 902, 903, 904, 905, 907, 909, 911, or 913 may be performed for the determined area.

A plurality of mobile devices may send signals reporting the results of the diagnostic radio signal measurements performed by the plurality of mobile devices. The results of the radio signal measurements may be stored in a leak measurement database. The results of the radio signal measurements may be sorted based on area information of each measurement. For example, an area corresponding to a specific ZIP code (e.g., Zip code A, Zip code B, etc.) may be determined and the area may be divided into a plurality of zones (e.g., zone 1, zone 2, zone 3, etc.). Table 1 shows an example of measurement data stored in the leak measurement database. Each row of Table 1 may correspond to a measurement data entry.

The leak measurement database may store a plurality of measurement data entries. Each measurement data entry may comprise location information (e.g., GPS coordinates), detected FM signal strength, detected FM signal source direction, a measurement time, and other information. The location information may be a location of a mobile device at the time of the measurement of a diagnostic FM signal leakage. The detected FM signal strength may be diagnostic FM signal strength (e.g., measured in dB) measured by the mobile device. The detected FM signal source direction may be a direction of the detected FM signal source determined from the location of the mobile device. Each mobile device may estimate the direction of the detected FM signal source, for example, by using the acceleration data and the gyroscope data. The linear Doppler Effect and/or the angular Doppler Effect associated with a plurality of signal measurements made while moving/rotating the mobile device may be used in estimating the direction. The measurement time/date may be a time at which the mobile device measured the FM signal leakage.

The measurement data may further comprise a mobile device identifier (ID), an address associated with the mobile device, and/or a user ID associated with a wired network service provider (e.g., an HFC network service provider). Subscription information of a plurality of users for a wired network service (e.g., Internet connection services) and/or a media data service (e.g., cable TV services) may be stored in the leak measurement database or another database associated with the leak measurement database. The subscription information may comprise credentials (e.g., user IDs and passwords) of the plurality of users, mobile device IDs (e.g., mobile phone numbers) of the plurality of users, addresses of the plurality of users, etc. Based on the subscription information, one or more users of mobile devices residing in a specific zone, (e.g., zone 1 of ZIP code A) may be identified. For example, the computing device may identify that user 1 resides at 1001 Pender Dr. of zone 1 of ZIP code A and may identify a mobile device ID of the user 1. The computing device may communicate with the mobile device of the user 1 and may determine the current location of the mobile device. For example, it may be determined whether the mobile device is currently located at the registered address 1001 Pender Dr. by receiving GPS information of the mobile device of the user 1. Wi-Fi access point ID associated with the address of each user may be stored. For example, the subscription information of the user 1 may comprise the Wi-Fi access point ID of the user 1 (e.g., AP1). The mobile device of the user 1 may scan one or more Wi-Fi

TABLE 1

| Zone | Location (GPS coordinates) | Detected FM Signal strength | Direction (X, Y, Z) | Measurement Time (HH:MM:SS)/ Date |
|---|---|---|---|---|
| Zone 1 - Zip code A | (Lat: 38.8638, Long: −77.3498, Alt: 119) | 20 μV/m | (4, −5, 10) | 23:50:00/Jul. 15, 2018 |
| Zone 1 - Zip code A | (Lat: 38.8641, Long: −77.3595, Alt: 119) | 10 μV/m | (2, 10, −1) | 22:41:03/Jul. 11, 2018 |
| Zone 2 - Zip code A | (Lat: 38.8640, Long: −77.3501, Alt: 120) | 5 μV/m | (10, 3, 4) | 20:31:02/Jul. 15, 2018 |
| . . . | . . . | . . . | . . . | . . . |
| Zone 2 - Zip code B | (Lat: 38.9983, Long: −77.5015, Alt: 92) | 17 μV/m | (8, −7, 10) | 08:01:02/Jul. 10, 2018 |
| Zone 2 - Zip code B | (Lat: 38.9987, Long: −77.5014, Alt: 100) | 14 μV/m | (−7, −2, 10) | 08:02:11/Jul. 10, 2018 |
| Zone 2 - Zip code B | (Lat: 38.9987, Long: −77.5011, Alt: 90) | 6 μV/m | (5, 2, 10) | 07:30:21/Jul. 11, 2018 | signals around the address of the user 1 and may provide Wi-Fi access point IDs of neighbors of the user 1. One or more Wi-Fi access point IDs associated with each address may be received and stored in the leak measurement database or another database associated with the leak measurement database. Table 2 shows another example of measurement data stored in the leak measurement database. Each row of Table 2 may correspond to a measurement data entry.

TABLE 2

| Zone | User Information | Mobile Device ID | Location (GPS coordinates) | Address | Wi-Fi Access Point ID |
|------|------------------|------------------|----------------------------|---------|------------------------|
| Zone 1 - Zip code A | User 1 | 703-240-1234 | (Lat: 38.8638, Long: −77.3498, Alt: 119) | 1001 Pender Dr. | AP1 |
| Zone 2 - Zip code A | User 2 | 703-241-1234 | (Lat: 38.8641, Long: −77.3595, Alt: 119) | 1002 Pender Dr. | AP2 |
| Zone 3 - Zip code A | User 3 | 703-241-1111 | (Lat: 38.8640, Long: −77.3501, Alt: 120) | 1010 Pender Dr. | AP3 |
| ... | ... | ... | ... | ... | ... |
| Zone 1- Zip code B | User 4 | 703-241-2222 | (Lat: 38.9983, Long: −77.5015, Alt: 92) | 1001 Delaney Alley | AP4 |
| Zone 2 - Zip code B | User 5 | 703-241-3333 | (Lat: 38.9987, Long: −77.5014, Alt: 100) | 1002 Delaney Alley | AP5 |
| Zone 3 - Zip code B | User 6 | 703-241-4444 | (Lat: 38.9987, Long: −77.5011, Alt: 90) | 1003 Delaney Alley | AP6 |

Although not shown in Table 1 or Table 2, each measurement data entry may further comprise Wi-Fi signal strength of one or more Wi-Fi access signals. The Wi-Fi signal strength comprised in a measurement data entry may be used to more accurately determine the current location of a mobile device associated with the measurement data entry (e.g., when a mobile device is located in a building where a GPS signal reception is not available). Each Wi-Fi access point and Wi-Fi signal strength from each Wi-Fi access point may be used as fingerprints to determine the location of a mobile device (e.g., inside an office building). It may be determined that a mobile device is located between the premises 102a and the premises 102b, for example, if the mobile device sends information of Wi-Fi signal strengths of Wi-Fi routers of the premises 102a and 102b.

Figure 10:
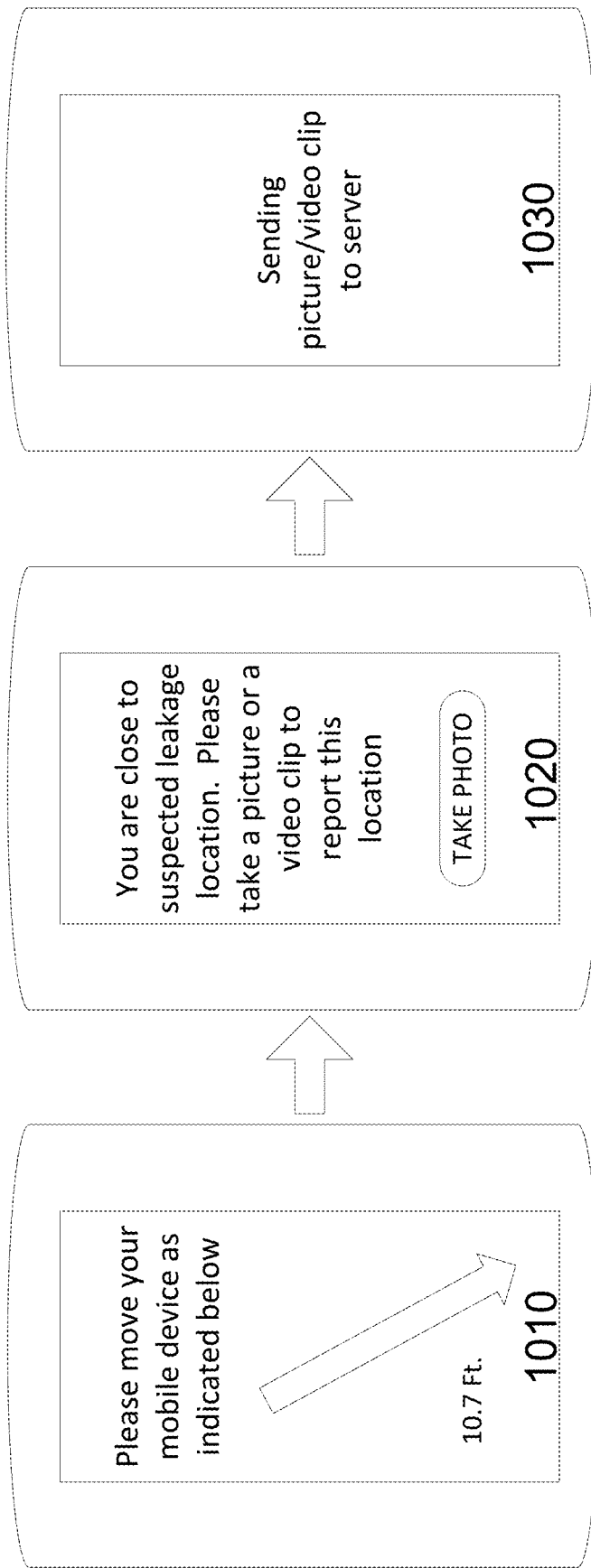
FIG. 10 shows an example user interface of a mobile device to guide a user to a suspected leak location.

FIG. 10 shows an example user interface of a mobile device to guide a user to a suspected leak location. The user may take a photograph or generate a video clip showing the suspected leak location that may help the service provider of the wired network to address a possible signal leakage. A user may also want to check the suspected leak location to determine if he could fix the problem by himself. The user interface may guide the user to the suspected leak location by providing directional (and/or navigational) indicators. One or more mobile devices may output (e.g., display) a first user interface (e.g., a graphic user interface 1010) indicating a direction of an FM signal leakage source. The one or more mobile devices may estimate the direction based on acceleration data and/or gyroscope data. Additionally, or alternatively, a computing device associated with the wired network may aggregate measurement reports from a plurality of mobile devices and may estimate the leakage point more accurately. The estimated leakage point may be informed to the mobile devices so that the mobile devices may calculate the direction of the leakage point more accurately. The leakage point may be identified as (Latitude, Longitude, Altitude) format or other formats. The direction may be indicated as a 2-dimensional direction, such as (Δ Latitude, Δ Longitude), or 3-dimensional direction, such as (Δ Latitude, Δ Longitude, λ Altitude). Δ Latitude refers to the difference between the latitude of the leakage point and the latitude of the mobile device. Δ Longitude refers to the difference between the longitude of the leakage point and the longitude of the mobile device. Δ Altitude refers to the difference between the altitude of the leakage point and the altitude of the mobile device.

The first user interface may further indicate the difference between the altitude at which the FM signal leakage source is located and the altitude at which the mobile device is located, for example, if the first user interface provides the 3-dimensional direction. The location of the leakage source may be determined (e.g., by the computing device of the wired network) and may be informed to the mobile devices. To determine the difference between the altitudes, the mobile devices may compare the altitude of the location of the leakage source and the currently altitude of the mobile device. For example, each of the mobile devices 125a, 125f, and 125g (e.g., shown in FIG. 5) may output a user interface indicating a direction of an FM signal leakage 531. The direction indicated in the user interface may be determined by the computing device, for example, by providing the leakage point estimated by the computing device. The mobile devices 125a, 125f, and 125g may report measurement results to the computing device. The first user interface of the mobile device 125g may indicate that a difference between the altitude at which the FM signal leakage 531 is located and the altitude at which the mobile device 125g is located is negligible (e.g., the difference is less than a threshold value). The user of the mobile device 125g may move along the same floor to identify the FM signal leakage 531. The computing device may estimate, based on the three measurements results received from the mobile devices 125a, 125f, and 125g, the location of the FM signal leakage 531. The computing device may send, to the mobile devices 125a, 125f, and 125g, the predicted location of the FM signal leakage 531 and cause the mobile devices 125a, 125f, and 125g to output the user interface based on the estimated leakage point, (e.g., the FM signal leakage 531).

A mobile device (e.g., the mobile device 125g) may output a second user interface (e.g., a graphic user interface 1020) indicating that the mobile device is close to the suspected leakage location (e.g., the FM signal leakage 531). The mobile device may track the changing position of the mobile device based on GPS data, acceleration data, gyroscope data, and/or data of other sensors of the mobile device. The direction between the estimated leakage point and the current position of the mobile device may be updated in real-time, and the updated direction may be output via the first user interface and/or the second user interface. The second user interface may comprise a button to take a picture (or a video) to capture one or more images (or a video clip) of the surrounding of the suspected leakage location. The mobile device may send, to the computing device (e.g., a server), the captured one or more images (or the video clip). The mobile device may output a third interface (e.g., a graphic user interface 1030) indicating that the mobile device has sent the captured one or more images (or the video clip). Based on the provided photo and/or the video clip, the service provider may provide the mobile device with instructions as to how the signal leakage can be fixed.

Figure 11:
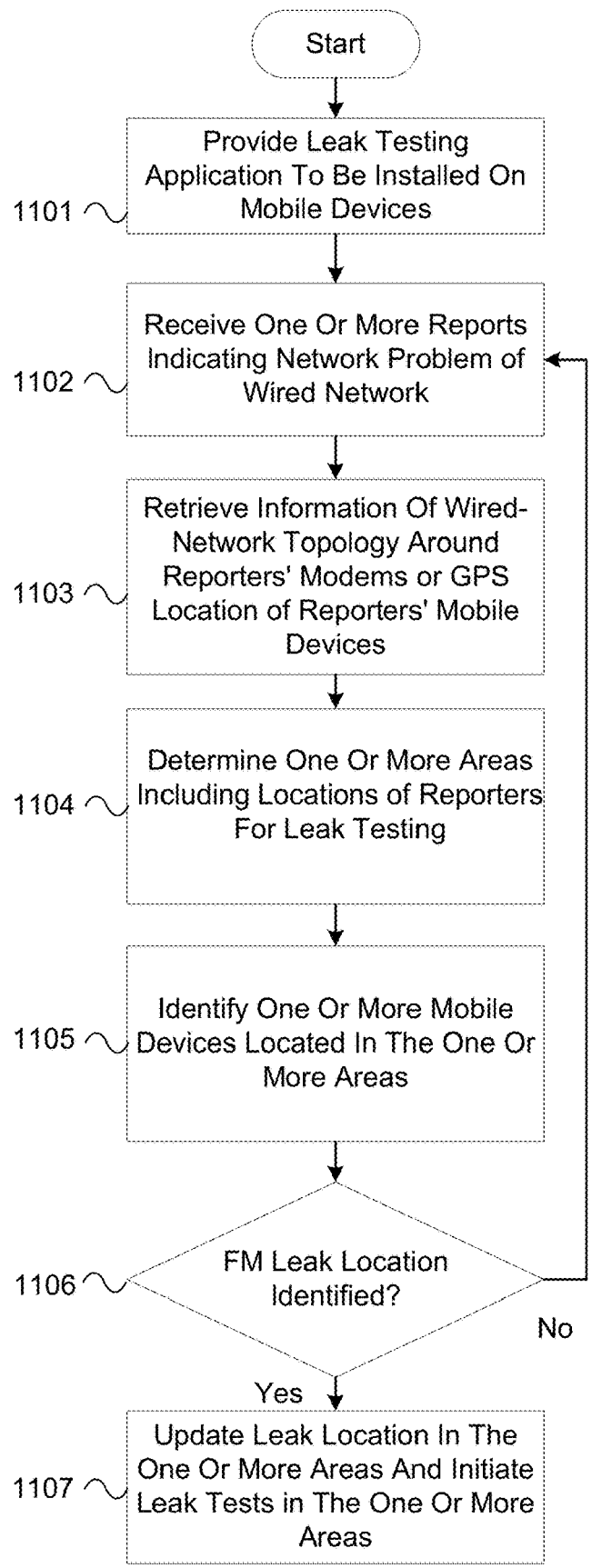
FIG. 11 shows an example method for identifying one or more areas to perform a leak testing and performing a leak testing in the one or more areas.

FIG. 11 shows an example method for identifying one or more areas to perform a leak testing and performing a leak testing in the one or more areas. A computing device (e.g., the diagnostic server 122, the computing device 200, etc.) may perform the operations shown in FIG. 11. Some or all steps shown in FIG. 11 may also or alternatively be performed by one or more other computing devices (e.g., the TS 104, a server communicating with a mobile device and/or with a termination system, etc.). One or more steps may be added, omitted, and/or rearranged. At step 1101, a leak testing application may be provided to a plurality of mobile devices for installation. The leak testing application may require (e.g., when the application is installed on a mobile device) a user authorization to access and/or use the GPS location of the mobile devices to facilitate the acquisition and storage of user's GPS data on the leak measurement database. The leak testing application may require a user authorization to other rights, such as the control and use of radio receivers equipped in the mobile devices. At step 1102, one or more reports indicating a network problem of a wired network may be received. The network problem may include a failure of the Internet connection via the wired network, a deterioration of the service quality of the wired network, etc. At step 1103, information of a wired-network topology around a modem of a reporter (e.g., a cable modem) or a location (e.g., a GPS location) of a mobile device of the reporter may be retrieved. The information of the wired-network topology between a termination system and the testing area (e.g., from the leak measurement database) may also be retrieved. The information of the wired-network topology may provide information about nodes and branches of the wired-network. Information of a wired-network topology associated with a particular address at which the mobile device is located may include information about nodes and branches of the wired-network between a termination system and the particular address. At step 1104, one or more areas for a leak testing may be determined. The one or more areas may include areas identified based on the information of the wired-network topology and the one or more reports. For example, the one or more areas may include the location of the premises in which the modem of the reporter is placed or the location of the mobile device of the reporter.

The one or more areas may also be determined based on a leak measurement schedule. As described above, a leak testing for a particular area may be performed periodically. A leak measurement process for the particular area may be triggered even without receiving a report associated with that area, for example, if the leak measurement for the particular area has not been performed for a period of time greater than a threshold time period.

At step 1105, one or more mobile devices located in the one or more areas may be identified. The identification of the one or more mobile devices may be based on the current GPS location of the one or more mobile devices. For example, the one or more mobile devices may send their GPS data to the computing device of the wired network, for example, if the one or more mobile devices moved into the one or more areas. The users of the one or more mobile devices may have agreed to provide the GPS data via the leak testing application. The computing device of the wired network may update and provide the one or more areas requiring a leak testing. Mobile devices that have installed the leak testing application may receive the updates about the one or more areas requiring a leak testing, and may provide their GPS data, for example, the mobile devices are currently located in the one or more areas.

The computing device may have a general access right to the GPS data of all mobile devices that have installed the leak testing application. The computing device of the wired network may request the GPS data of all of the mobile devices that have installed the leak testing application, for example, if one or more new areas for a leak testing have been updated. After receiving the GPS data from the mobile devices, the computing device may identify one or more mobile devices currently located in the one or more new areas for a leak testing.

A list of portions of the wired network to be tested for signal leakage may be provided to a plurality of mobile devices. The list may be provided via a leak test application installed on the mobile devices. The mobile devices may determine whether they are located in an area comprising one of the portions of the wired network, for example, based on a comparison between the list and the GPS location of the mobile devices. The mobile devices may provide their GPS data, for example, if the mobile devices are located at one of the portions of the wired network. The mobile devices may send a signal to the computing device so that a diagnostic signal can be sent on the at least one of the portions of the wired network. The computing device of the wired network may receive the GPS data from the mobile devices and identify at least a subset of mobile devices that are located at one of the portions of the wired network.

FM receivers of mobile devices located in an area associated with the reporter may be conditionally and secretly activated (e.g., by the computing device). A signal (e.g., a cellular signal) may be sent to one or more mobile devices to cause the activation of the FM receivers of the one or more mobile devices for a diagnostic radio signal measurement.

The signal sent to the mobile devices may comprise an activation code (e.g., a random code, a temporary code, etc.) that may temporarily activate the FM receivers. The activation code may be determined by the computing device and/or a computing device of a mobile communication network. The users of the mobile devices may be prohibited from activating the FM receivers. To restrict the access to the FM receivers, the mobile communication network may set a lock to the FM receivers. The mobile communication network and/or the computing device of the wired network may be granted one or more rights to temporarily unlock the access restriction to the FM receivers, for example, for the leak testing. The FM receivers may be configured to be unlocked based on a verification of a signal from the computing device of the wired network operator and/or a computing device of the mobile communication network operator. A timer may start to run after activating the FM receivers, and the FM receivers may be locked again, for example, if the timer expires or if the computing device of the wired network operator and/or a computing device of the mobile communication network operator sends another control signal to lock the FM receivers.

A computing device of the wired network may send, to the mobile devices, signals (e.g., cellular signals) instructing the mobile devices to perform FM signal leak measurements. The mobile devices may measure a diagnostic FM signal and may determine the direction of the FM signal source. The mobile devices may use one or more sensors (e.g., a GPS module, a Wi-Fi communication module, an accelerometer, a gyroscope, etc.) to determine the direction of the FM signal source in association with the location of the mobile devices. As described above, the one or more sensors may detect the movement and/or rotation of mobile devices and may determine changes of frequencies and other parameters of detected diagnostic FM signals. A plurality of measurements of the diagnostic FM signals while the mobile devices are moving and/or rotating may be used to estimate the direction of the FM signal source and the current location (e.g., coordinates) of the mobile devices. The linear Doppler Effect and/or angular Doppler Effect may be used for the estimation of the direction. Signals (e.g., cellular signals) reporting the FM signal measurements may be received from the mobile devices. After receiving one or more measurement reports from the mobile devices, the computing device may send a signal that cause deactivation of the FM receivers of the mobile devices.

Figure 12:
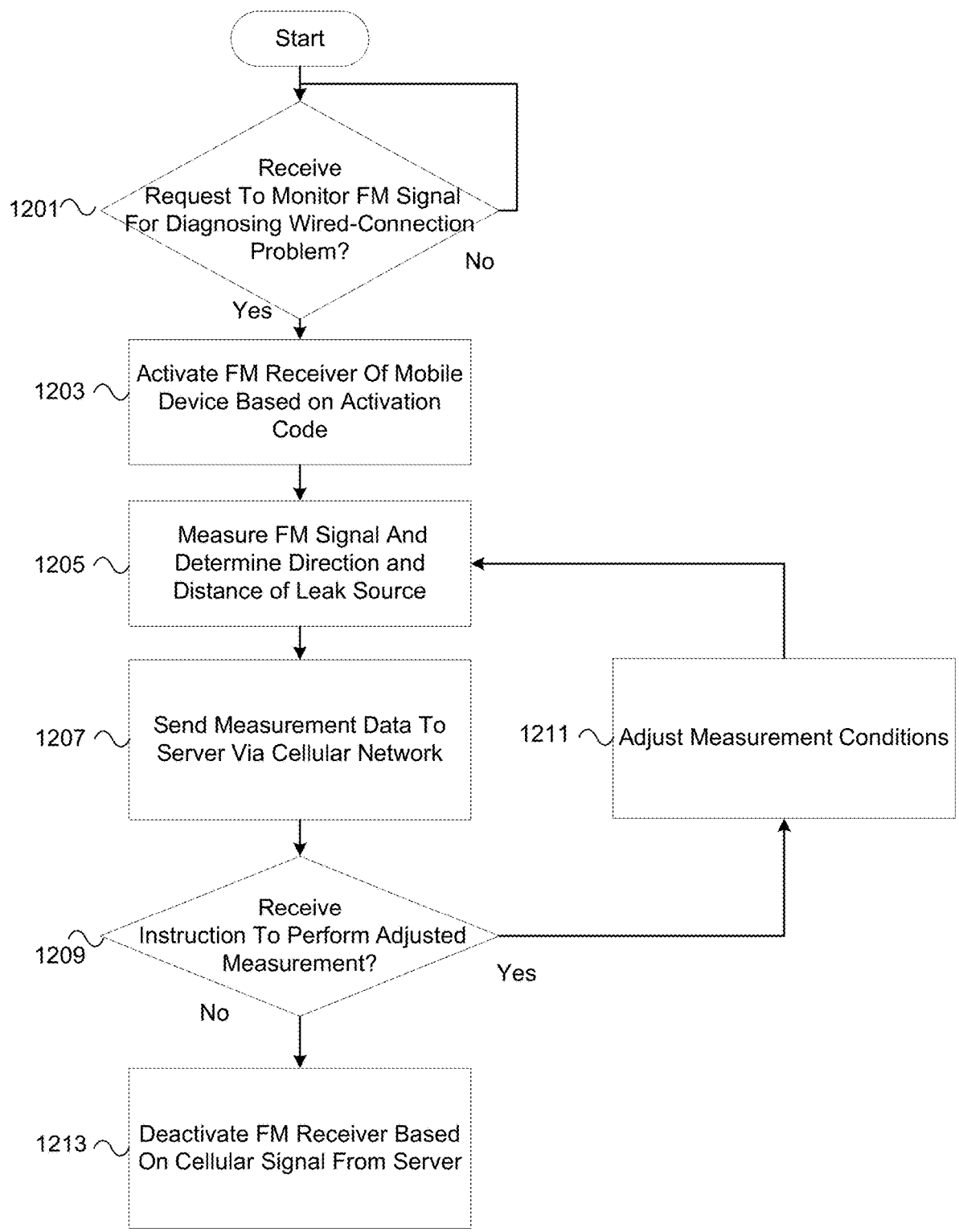
FIG. 12 shows an example method for measuring an FM signal that may be performed by a mobile device.

FIG. 12 shows an example method for measuring an FM signal that may be performed by a mobile device. A mobile device (e.g., the mobile device(s) 125, the computing device 200, etc.) may perform the operations shown in FIG. 12. Some or all steps shown in FIG. 12 may also or alternatively be performed by one or more other computing devices (e.g., a device communicating with a mobile device and/or with a termination system, etc.). One or more steps may be added, omitted, and/or rearranged. At step 1201, from a computing device, a request to measure an FM signal (e.g., for diagnosing a wired-connection problem) may be received. The request may be received by the mobile device via a wireless communication (e.g., cellular signal communication). The mobile device may receive a signal that activates an FM receiver of the mobile device. The request may comprise the signal that activates the FM receiver of the mobile device or the request and the signal that activates the FM receiver may be sent separately. At step 1203, an FM receiver of the mobile device may be activated. The FM receiver may be activated, for example, if the mobile device verifies the signal that activates the FM receiver is received from the computing device of the mobile communication network and/or the computing device of the wired network. At step 1205, the mobile device may measure an FM signal and determine a direction and distance of an FM leak source. As described above, the mobile device may detect the diagnostic FM signal, for example, based on information about the diagnostic FM signal sent from the computing device (e.g., the modulation frequency information, the pseudo random code, etc.) The mobile device may move and/or rotate while performing a plurality of signal measurements. The measurements data, the acceleration data, the gyroscope data, and/or other data measured by one or more sensors of the mobile device may be used to estimate the direction of the diagnostic FM signal. At step 1207, the mobile device may send, to the computing device (e.g., the diagnostic server 122), measurement data. The measurement data may be sent via a cellular signal communication.

At step 1211, one or more measurement conditions may be adjusted, for example, if the mobile device receives an instruction to perform an adjusted measurement. The adjustment of the one or more measurement conditions may comprise a location change of the mobile device (e.g., rotating or moving the mobile device), a measurement of a diagnostic FM signal after changing one or more parameters of the diagnostic FM signal, etc. For example, the one or more parameters of the diagnostic FM signal may be changed and the FM transmitter may send a modified diagnostic FM signal (e.g., modified based on the one or more parameters). The one or more parameters may be sent to the mobile device so that the mobile device may monitor the modified diagnostic FM signal. At step 1213, the FM receiver may be deactivated, for example, if the mobile device receives a signal that indicates deactivation of the FM receiver. The mobile device may receive, from the computing device and via a cellular signal communication, the signal that indicates the deactivation of the FM receiver.

Figure 13:
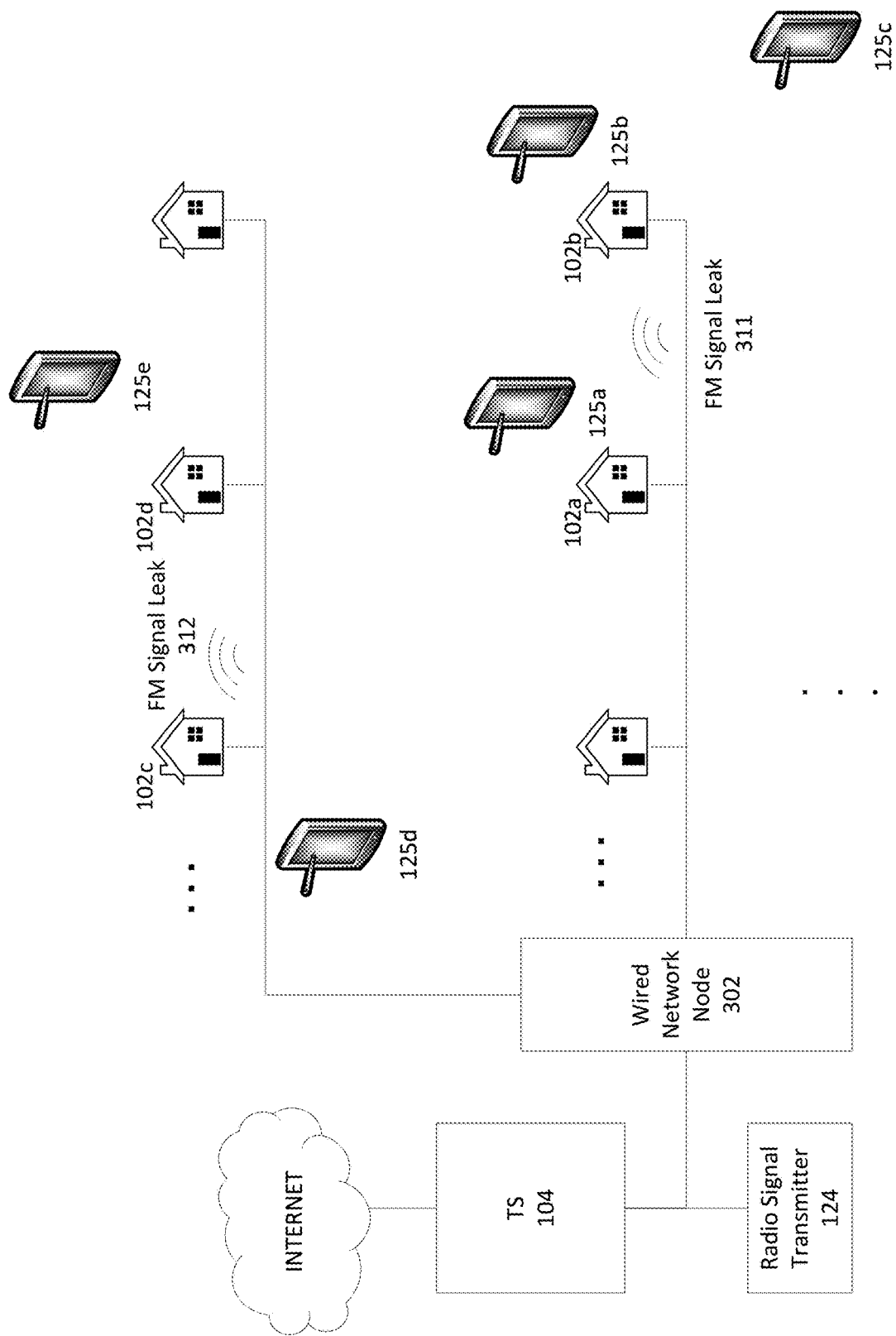
FIG. 13 shows an example communication network that may provide a plurality of radio signals to one or more mobile devices via a wired network.

FIG. 13 shows an example communication network that may provide a plurality of radio signals to one or more mobile devices via a wired network (e.g., a Hybrid Fiber Coaxial (HFC) network). FIG. 13 shows a plurality of branches stemming from the wired network node 302. A plurality of FM signal leak sources may be present in a certain area, and a mobile device (e.g., the mobile device 125a and 125d) may detect a plurality of FM signal leaks 311 and 312 at the same time. The mobile device may distinguish each of a plurality of diagnostic FM signals leaked from the plurality of FM signal leak sources. Each of the plurality of diagnostic FM signals may be based on a high precision clock signal. A mobile device may receive the plurality of diagnostic FM signals and may determine a timing signal on a carrier of each diagnostic FM signal. The mobile device may identify, based on the timing signals, one diagnostic FM signal from other diagnostic FM signals. For example, each of the plurality of diagnostic FM signals may comprise different timing signals. A mobile device may distinguish the diagnostic FM signals from each other by identifying different timing signals.

Each of the plurality of diagnostic FM signals may comprise a different pseudo random code. A mobile device may receive different FM signals at the same time and may distinguish the diagnostic FM signals from each other by identifying different pseudo random codes. Each diagnostic FM signal may be generated based on a different pseudo random code. For example, each of the plurality of diagnostic FM signals may be modulated or multiplexed based a different pseudo random code. The wired network node 302 may filter different diagnostic FM signals and may route different diagnostic FM signals to different branches.

One or more different radio frequency signals may be used in addition to, or in replacement of, the diagnostic FM signals described above. Different carrier frequencies and/or modulation schemes may be used for one or more radio frequency signals, for example, if the carrier frequency and/or other modulation frequencies of the one or more radio frequency signals are within the transmission band of the wired-communication network.

Figure 14:
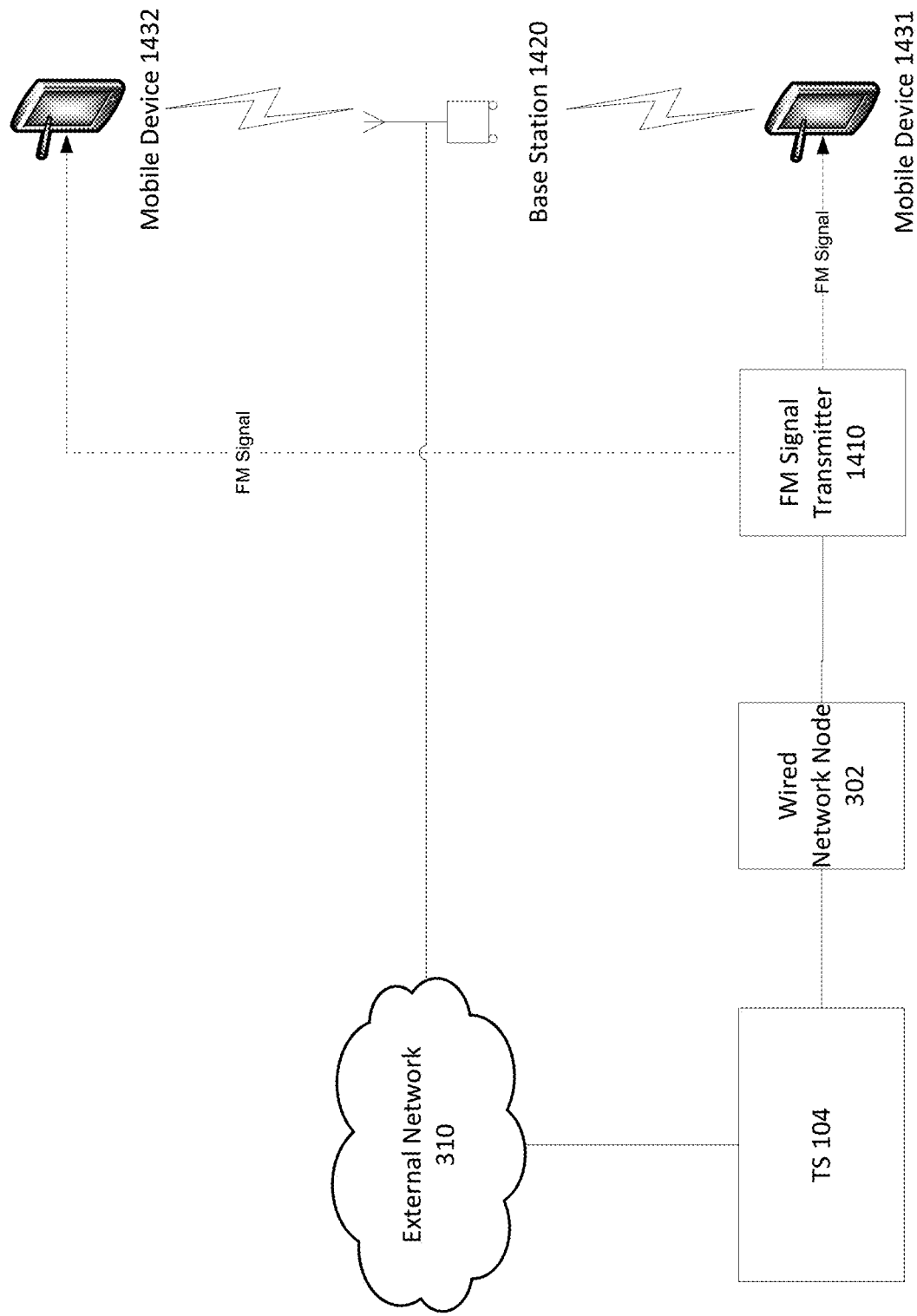
FIG. 14 shows an example communication network that may provide a local FM signal for content distribution.

FIG. 14 shows an example communication network that may provide a local FM signal for content distribution. One or more FM signal transmitters 1410 may be connected to the wired-network. For example a set-top box may comprise an FM transmitter to receive one or more content FM signals via the wired-network and to transmit the received one or more content FM signals. The one or more content FM signals transmitted by the set-top box may provide various contents, such as music contents, news contents, etc., and may use frequencies for carrier signals different from the frequencies for carrier signals for the FM leak measurements. For example, the content FM signals may be distinguished from the diagnostic FM signals based on different pseudo random codes, different modulation frequencies, etc. Each FM signal transmitter 1410 at various locations may wirelessly transmit different content FM signals, thereby enabling a localized FM content distribution service. For example, mobile devices 1431 and 1432 may receive the same music content by detecting a first content FM signal transmitted by a first FM signal transmitter located at a first location, and other mobile devices (not shown) may receive a different content by detecting a second content FM signal transmitted by a second FM signal transmitter located at a second location. The activation of the FM tuners of each mobile device may be controlled by the service provider of the wired network and/or the mobile communication service provider, for example, as described above.

Although examples are described above, features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only, and is not limiting.

The invention claimed is:

1. An apparatus comprising:
  one or more processors; and
  memory storing instructions that, when executed by the one or more processors, cause the apparatus to:
    determine a portion of a wired network to be tested;
    determine one or more handheld mobile devices that are registered to receive data service at a premises located within a threshold distance from the portion of the wired network;
    cause the one or more handheld mobile devices to monitor for a wireless diagnostic signal;
    cause the wired network to emit the wireless diagnostic signal; and
    receive, from the one or more handheld mobile devices, information indicating whether the wireless diagnostic signal was detected.

2. The apparatus of claim 1, wherein the instructions, when executed by the one or more processors, cause the apparatus to:
  receive, from the one or more handheld mobile devices, information indicating testing availability; and
  download, to the one or more handheld mobile devices, a list of portions of the wired network to be tested for signal leakage.

3. The apparatus of claim 1, wherein the instructions, when executed by the one or more processors, cause the apparatus to:
  determine, based on the information, signal leakage measurements associated with the one or more handheld mobile devices; and
  update, based on global positioning system (GPS) coordinates received from the one or more handheld mobile devices, a signal leakage status associated with the portion of the wired network.

4. The apparatus of claim 1, wherein the instructions, when executed by the one or more processors, cause the apparatus to:
  determine, based on the portion of the wired network, a test time for the portion of the wired network.

5. The apparatus of claim 1, wherein the instructions, when executed by the one or more processors, cause the apparatus to:
  determine the one or more handheld mobile devices based on an address of the portion of the wired network.

6. The apparatus of claim 1, wherein the instructions, when executed by the one or more processors, cause the apparatus to:
  determine the one or more handheld mobile devices based on an address of the portion of the wired network, wherein the one or more handheld mobile devices comprise devices associated with users who are neighbors to the address.

7. The apparatus of claim 1, wherein the memory storing instructions that, when executed by the one or more processors, cause the apparatus to further perform:
  sending, to at least one of the one or more handheld mobile devices, an indication to rotate, while measuring the wireless diagnostic signal, the at least one of the one or more handheld mobile devices; and
  determining, based on one or more measurements of the wireless diagnostic signal and based on one or more parameters associated with a rotation of the at least one of the one or more handheld mobile devices, a signal leakage point.

8. The apparatus of claim 1, wherein the one or more handheld mobile devices that are registered to receive data service are one or more smart phones connected to a Wi-Fi network of the premises.

9. The apparatus of claim 1, wherein the one or more handheld mobile devices that are registered to receive data service at the premises are identified in account information associated with a location of the premises.

10. A non-transitory computer-readable medium storing instructions that, when executed, cause:
  determining a portion of a wired network to be tested;
  determining one or more handheld mobile devices that are registered to receive data service at a premises located within a threshold distance from the portion of the wired network;
  causing the one or more handheld mobile devices to monitor for a wireless diagnostic signal;
  causing the wired network to emit the wireless diagnostic signal; and
  receiving, from the one or more handheld mobile devices, information indicating whether the wireless diagnostic signal was detected.

11. The non-transitory computer-readable medium of claim 10 storing instructions that, when executed, further cause:
  receiving, from the one or more handheld mobile devices, information indicating testing availability; and
  downloading, to the one or more handheld mobile devices, a list of portions of the wired network to be tested for signal leakage.

12. The non-transitory computer-readable medium of claim 10 storing instructions that, when executed, further cause:
  determining, based on the information, signal leakage measurements associated with the one or more handheld mobile devices; and updating, based on global positioning system (GPS) coordinates received from the one or more handheld mobile devices, a signal leakage status associated with the portion of the wired network.

13. The non-transitory computer-readable medium of claim 10 storing instructions that, when executed, further cause:
   determining, based on the portion of the wired network, a test time for the portion of the wired network.

14. The non-transitory computer-readable medium of claim 10 storing instructions that, when executed, further cause:
   determining the one or more handheld mobile devices based on an address of the portion of the wired network.

15. The non-transitory computer-readable medium of claim 10 storing instructions that, when executed, further cause:
   determining the one or more handheld mobile devices based on an address of the portion of the wired network, wherein the one or more handheld mobile devices comprise devices associated with users who are neighbors to the address.

16. The non-transitory computer-readable medium of claim 10 storing instructions that, when executed, further cause:
   sending, to at least one of the one or more handheld mobile devices, an indication to rotate, while measuring the wireless diagnostic signal, the at least one of the one or more handheld mobile devices; and
   determining, based on one or more measurements of the wireless diagnostic signal and based on one or more parameters associated with a rotation of the at least one of the one or more handheld mobile devices, a signal leakage point.

17. A system comprising:
   a computing device configured to:
      determine a portion of a wired network to be tested;
      determine one or more handheld mobile devices that are registered to receive data service at a premises located within a threshold distance from the portion of the wired network;
      cause the one or more handheld mobile devices to monitor for a wireless diagnostic signal;
      cause the wired network to emit the wireless diagnostic signal; and
      receive, from the one or more handheld mobile devices, information indicating whether the wireless diagnostic signal was detected; and
   the one or more handheld mobile devices.

18. The system of claim 17, wherein the computing device is further configured to:
   receive, from the one or more handheld mobile devices, information indicating testing availability; and
   download, to the one or more handheld mobile devices, a list of portions of the wired network to be tested for signal leakage.

19. The system of claim 17, wherein the computing device is further configured to:
   determine, based on the information, signal leakage measurements associated with the one or more handheld mobile devices; and
   update, based on global positioning system (GPS) coordinates received from the one or more handheld mobile devices, a signal leakage status associated with the portion of the wired network.

20. The system of claim 17, wherein the computing device is further configured to:
   determine, based on the portion of the wired network, a test time for the portion of the wired network.

21. The system of claim 17, wherein the computing device is further configured to:
   determine the one or more handheld mobile devices based on an address of the portion of the wired network.

22. The system of claim 17, wherein the computing device is further configured to:
   determine the one or more handheld mobile devices based on an address of the portion of the wired network, wherein the one or more handheld mobile devices comprise devices associated with users who are neighbors to the address.

23. The system of claim 17, wherein the computing device is further configured to:
   send, to at least one of the one or more handheld mobile devices, an indication to rotate, while measuring the wireless diagnostic signal, the at least one of the one or more handheld mobile devices; and
   determine, based on one or more measurements of the wireless diagnostic signal and based on one or more parameters associated with a rotation of the at least one of the one or more handheld mobile devices, a signal leakage point.

* * * * *

UNITED STATES PATENT AND TRADEMARK OFFICE
CERTIFICATE OF CORRECTION

PATENT NO. : 11,726,127 B2
APPLICATION NO. : 17/835529
DATED : August 15, 2023
INVENTOR(S) : Wolcott et al.

It is certified that error appears in the above-identified patent and that said Letters Patent is hereby corrected as shown below:

In the Specification

Column 4, Detailed Description, Line 21:
Delete "Protocol VoIP" and insert --Protocol—VoIP-- therefor Column 20, Detailed Description, Line 4:
Delete "$\lambda$" and insert --$\Delta$-- therefor Signed and Sealed this
Twenty-ninth Day of October, 2024

*Katherine Kelly Vidal*

Katherine Kelly Vidal
*Director of the United States Patent and Trademark Office*